United States Patent [19]

Iwasaki et al.

[11] Patent Number: 6,014,349

[45] Date of Patent: Jan. 11, 2000

[54] STORAGE APPARATUS USING VARIABLE READ CLOCK FREQUENCIES FOR READING ZCAV RECORDING MEDIUM

[75] Inventors: Masaaki Iwasaki; Shigenori Yanagi, both of Kawasaki; Shigeyoshi Tanaka, Higashine, all of Japan

[73] Assignee: Fujitsu Limited, Kawasaki, Japan

[21] Appl. No.: 09/017,853

[22] Filed: Feb. 3, 1998

[30] Foreign Application Priority Data

Aug. 28, 1997  [JP]  Japan .................................. 9-232161

[51] Int. Cl.[7] .............................. G11B 17/22; G11B 5/09
[52] U.S. Cl. ................................................ 369/32; 369/48
[58] Field of Search .............................. 369/32, 48, 47, 369/54, 59, 124

[56] References Cited

U.S. PATENT DOCUMENTS

| | | | |
|---|---|---|---|
| 5,400,309 | 3/1995 | Satomura | 369/32 |
| 5,561,652 | 10/1996 | Fujiwara et al. | 369/59 |
| 5,623,468 | 4/1997 | Takeda et al. | 369/48 |
| 5,717,669 | 2/1998 | Kimura et al. | 369/48 |

FOREIGN PATENT DOCUMENTS

| | | |
|---|---|---|
| 61-172223 | 8/1986 | Japan . |
| 61-273778 | 12/1986 | Japan . |
| 62-80865 | 4/1987 | Japan . |
| 528632 | 2/1993 | Japan . |
| 6150539 | 5/1994 | Japan . |
| 6215485 | 8/1994 | Japan . |
| 08063894 | 3/1996 | Japan . |
| 08293155 | 11/1996 | Japan . |

*Primary Examiner*—Tan Dinh
*Attorney, Agent, or Firm*—Greer, Burns & Crain Ltd.

[57] ABSTRACT

A frequency synthesizer generates, through setting of a frequency control value, a reference clock having a frequency necessary to read data from a medium. When reading data from an arbitrary position on the medium, a setting control unit sets in the frequency synthesizer a frequency control value corresponding to the zone position, thereby allowing the frequency synthesizer to control a reference clock frequency, and sets in a single or a plurality of processing units other than the frequency synthesizer a predetermined control value corresponding to the read position on the medium. A settling wait processing unit calculates a settling time T1 required for a frequency of the frequency synthesizer to become stable and a setting processing time T2 necessary for the setting control of the other processing unit, and defines as a wait time Tw a difference (T1−T2) between the settling time T1 and the setting processing time T2, during which wait time Tw a migration to the subsequent processing is kept waiting.

17 Claims, 26 Drawing Sheets

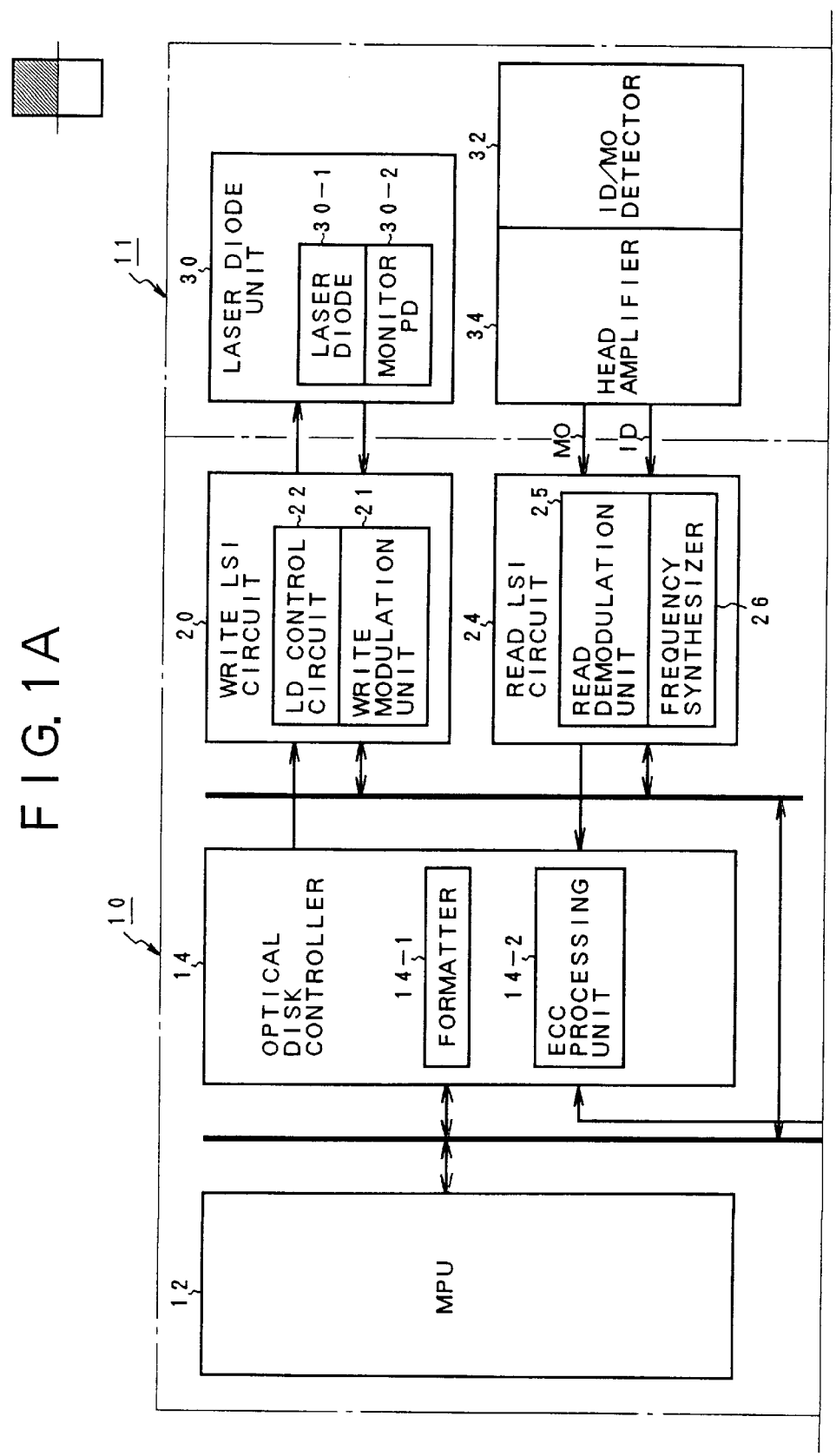

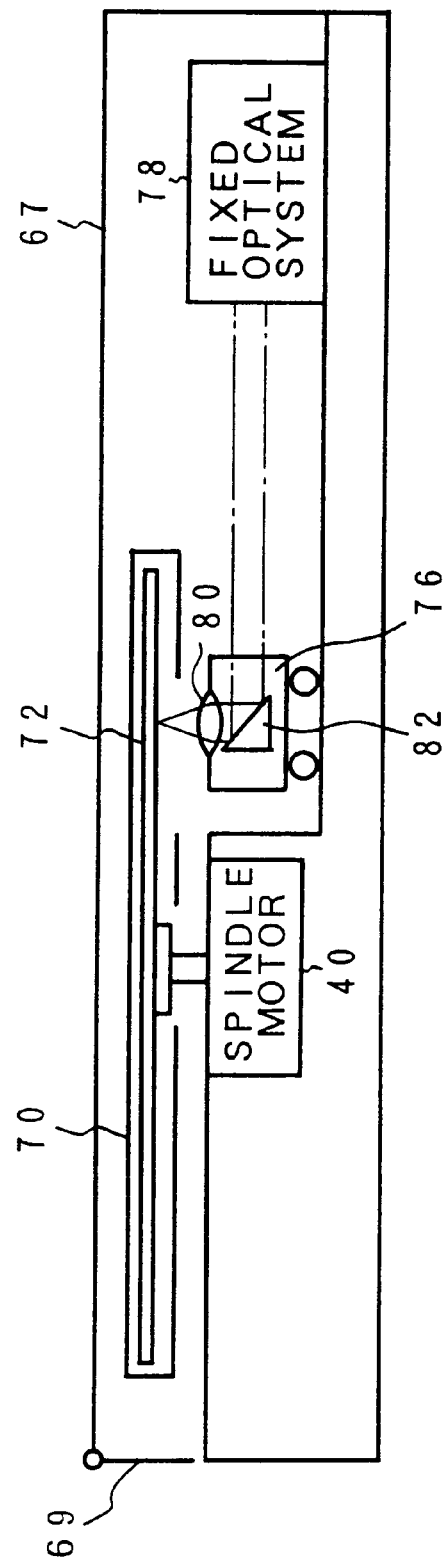

FIG. 5

| FORMAT | | 540MB MEDIUM | 640MB MEDIUM |
|---|---|---|---|
| ZONE | | CLOCK FREQUENCY MHz | CLOCK FREQUENCY MHz |
| READ IN ZONE | INITIAL ZONE | 22.41 | 21.71 |
| | LEARNING ZONE | 22.41 | 21.71 |
| | TEST ZONE | 22.41 | 21.71 |
| | CONTROL ZONE | 22.41 | 21.71 |
| | BUFFER ZONE | 22.41 | 21.71 |
| DATA ZONE (USER ZONE) | 0 | 23.34 | 23.26 |
| | 1 | 24.27 | 24.81 |
| | 2 | 25.21 | 26.36 |
| | 3 | 26.14 | 27.91 |
| | 4 | 27.07 | 29.46 |
| | 5 | 28.01 | 31.01 |
| | 6 | 28.94 | 32.56 |
| | 7 | 29.88 | 34.11 |
| | 8 | 30.81 | 35.66 |
| | 9 | 31.74 | 37.21 |
| | 10 | 32.68 | 38.76 |
| | 11 | 33.61 | — |
| | 12 | 34.54 | — |
| | 13 | 35.48 | — |
| | 14 | 36.41 | — |
| | 15 | 37.34 | — |
| | 16 | 38.28 | — |
| | 17 | 39.21 | — |
| READ OUT ZONE | TEST ZONE | 39.21 | 38.76 |
| | BUFER ZONE | 39.21 | 38.76 |

F I G. 6

| ZONE NO. | FREQUENCY DIVIDING VALUE | FREQUENCY DIVIDING VALUE (FIXED) | VCO FREQUENCY | DUMPING REGISTOR | EQ CUT-OFF FREQUENCY | SM CUT-OFF FREQUENCY |
|---|---|---|---|---|---|---|
| 00 | m00 | n | VCOFRQ00 | R1 | EQFRQ00 | SMFRQ00 |
| 01 | m01 | n | VCOFRQ01 | R1 | EQFRQ01 | SMFRQ01 |
| 02 | m02 | n | VCOFRQ02 | R1 | EQFRQ02 | SMFRQ02 |
| 03 | m03 | n | VCOFRQ03 | R1 | EQFRQ03 | SMFRQ03 |
| 04 | m04 | n | VCOFRQ04 | R1 | EQFRQ04 | SMFRQ04 |
| 05 | m05 | n | VCOFRQ05 | R1 | EQFRQ05 | SMFRQ05 |
| ... | ... | ... | ... | ... | ... | ... |
| 16 | m16 | n | VCOFRQ16 | R1 | EQFRQ16 | SMFRQ16 |
| 17 | m17 | n | VCOFRQ17 | R1 | EQFRQ17 | SMFRQ17 |

| ZONE NO. | FREQUENCY DIVIDING VALUE | FREQUENCY DIVIDING VALUE (FIXED) | VCO FREQUENCY | DUMPING REGISTOR | EQ CUT-OFF FREQUENCY | SM CUT-OFF FREQUENCY |
|---|---|---|---|---|---|---|
| 00 | m00 | n | VCOFRQ00 | R2 | EQFRQ00 | SMFRQ00 |
| 01 | m01 | n | VCOFRQ01 | R2 | EQFRQ01 | SMFRQ01 |
| 02 | m02 | n | VCOFRQ02 | R2 | EQFRQ02 | SMFRQ02 |
| 03 | m03 | n | VCOFRQ03 | R2 | EQFRQ03 | SMFRQ03 |
| 04 | m04 | n | VCOFRQ04 | R2 | EQFRQ04 | SMFRQ04 |
| 05 | m05 | n | VCOFRQ05 | R2 | EQFRQ05 | SMFRQ05 |
| 06 | m06 | n | VCOFRQ06 | R2 | EQFRQ06 | SMFRQ06 |
| 07 | m07 | n | VCOFRQ07 | R2 | EQFRQ07 | SMFRQ07 |
| 08 | m08 | n | VCOFRQ08 | R2 | EQFRQ08 | SMFRQ08 |
| 09 | m09 | n | VCOFRQ09 | R2 | EQFRQ09 | SMFRQ09 |
| 10 | m10 | n | VCOFRQ10 | R2 | EQFRQ10 | SMFRQ10 |

94-2

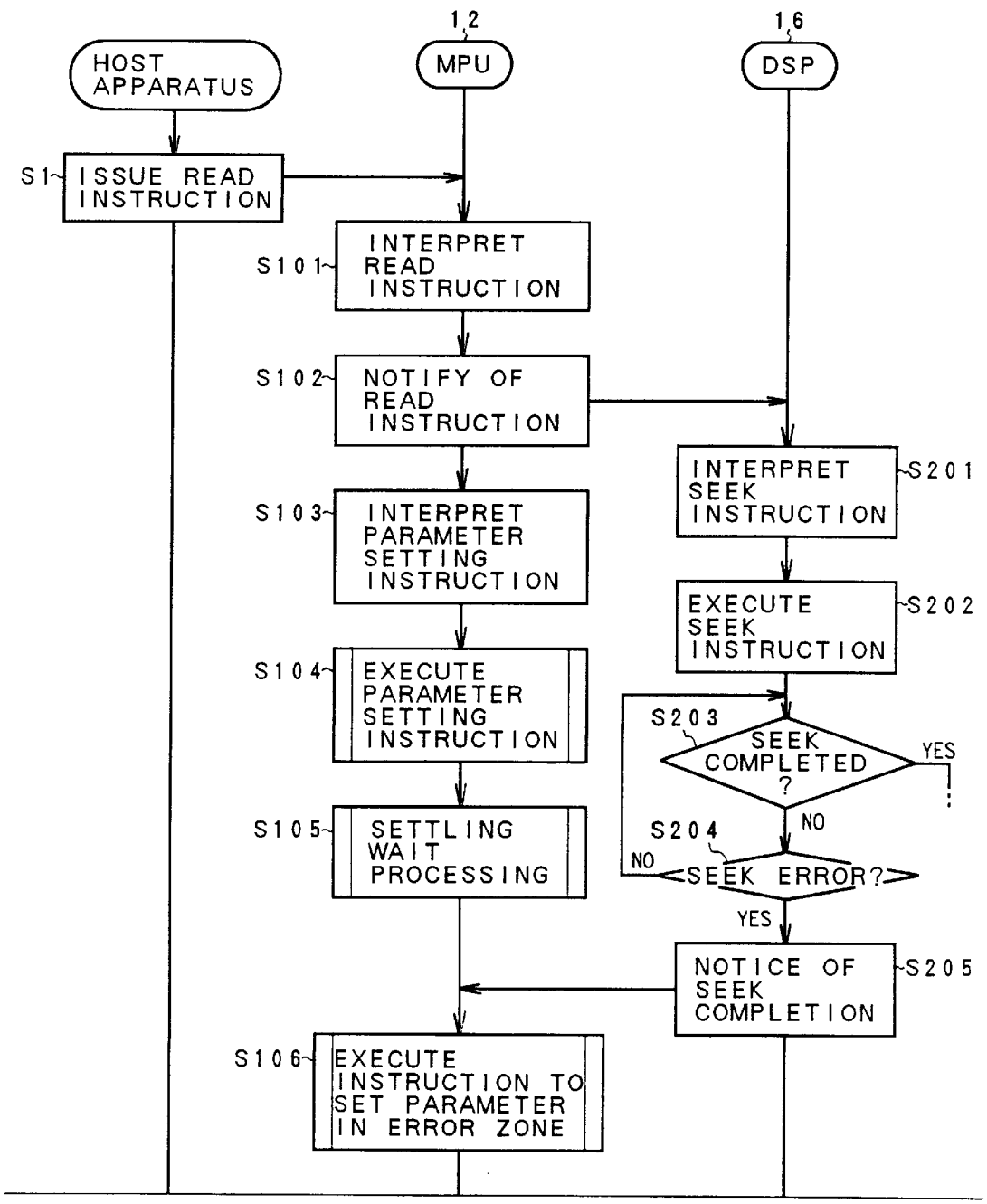

| ZONE NO. | CLOCK FREQUENCY | FREQUENCY DIVIDING VALUE | FREQUENCY DIVIDING VALUE (FIXED) |
|---|---|---|---|
| 0 | f00 | m00 | n |
| 1 | f01 | m01 | n |
| 2 | f02 | m02 | n |
| 3 | f03 | m03 | n |
| 4 | f04 | m04 | n |
| 5 | f05 | m05 | n |
| ⋮ | ⋮ | ⋮ | ⋮ |
| 16 | f16 | m16 | n |
| 17 | f17 | m17 | n |

F I G. 19

| ZONE NO. | CLOCK FREQUENCY | FREQUENCY DIVIDING VALUE | FREQUENCY DIVIDING VALUE (FIXED) |
|---|---|---|---|
| 0 | f00 | m00 | n |
| 1 | f01 | m01 | n |
| 2 | f02 | m02 | n |
| 3 | f03 | m03 | n |
| 4 | f04 | m04 | n |
| 5 | f05 | m05 | n |
| 6 | f06 | m06 | n |
| 7 | f07 | m07 | n |
| 8 | f08 | m08 | n |
| 9 | f09 | m09 | n |
| 10 | f10 | m10 | n |

94-2

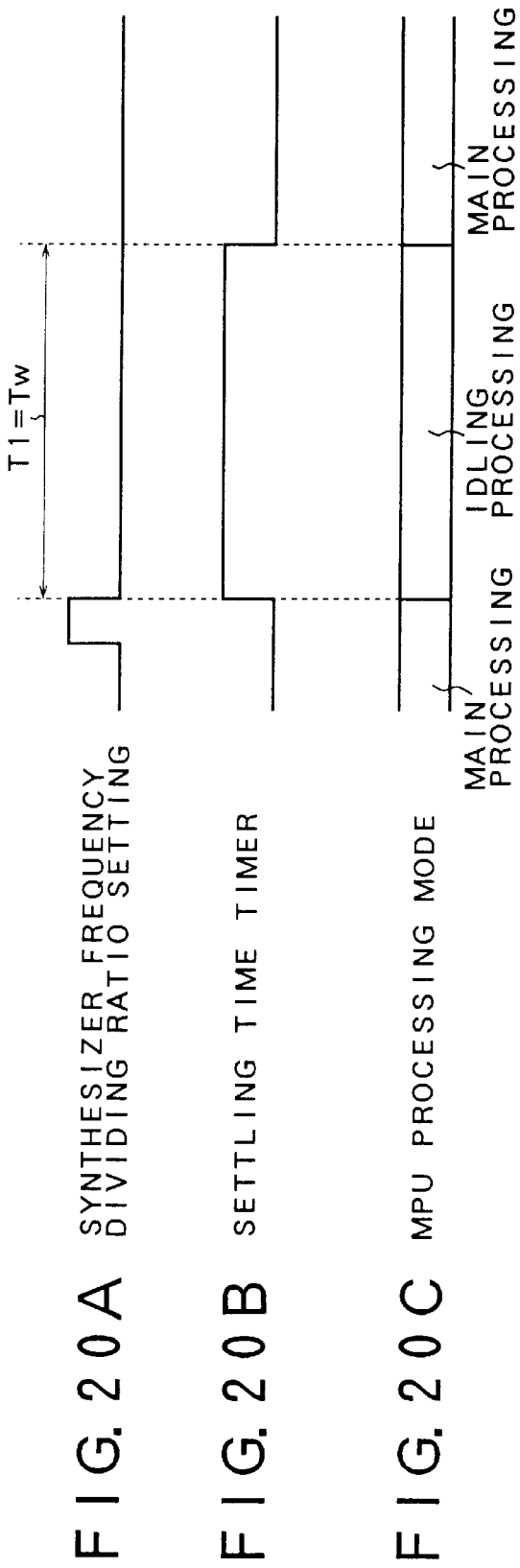

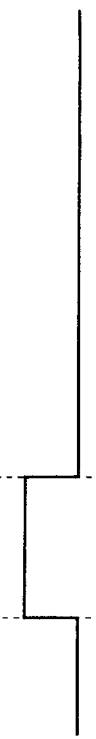
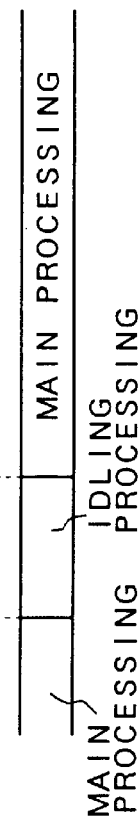
FIG. 21A SYNTHESIZER FREQUENCY DIVIDING RATIO SETTING
FIG. 21B SETTLING TIME TIMER
FIG. 21C MPU PROCESSING MODE

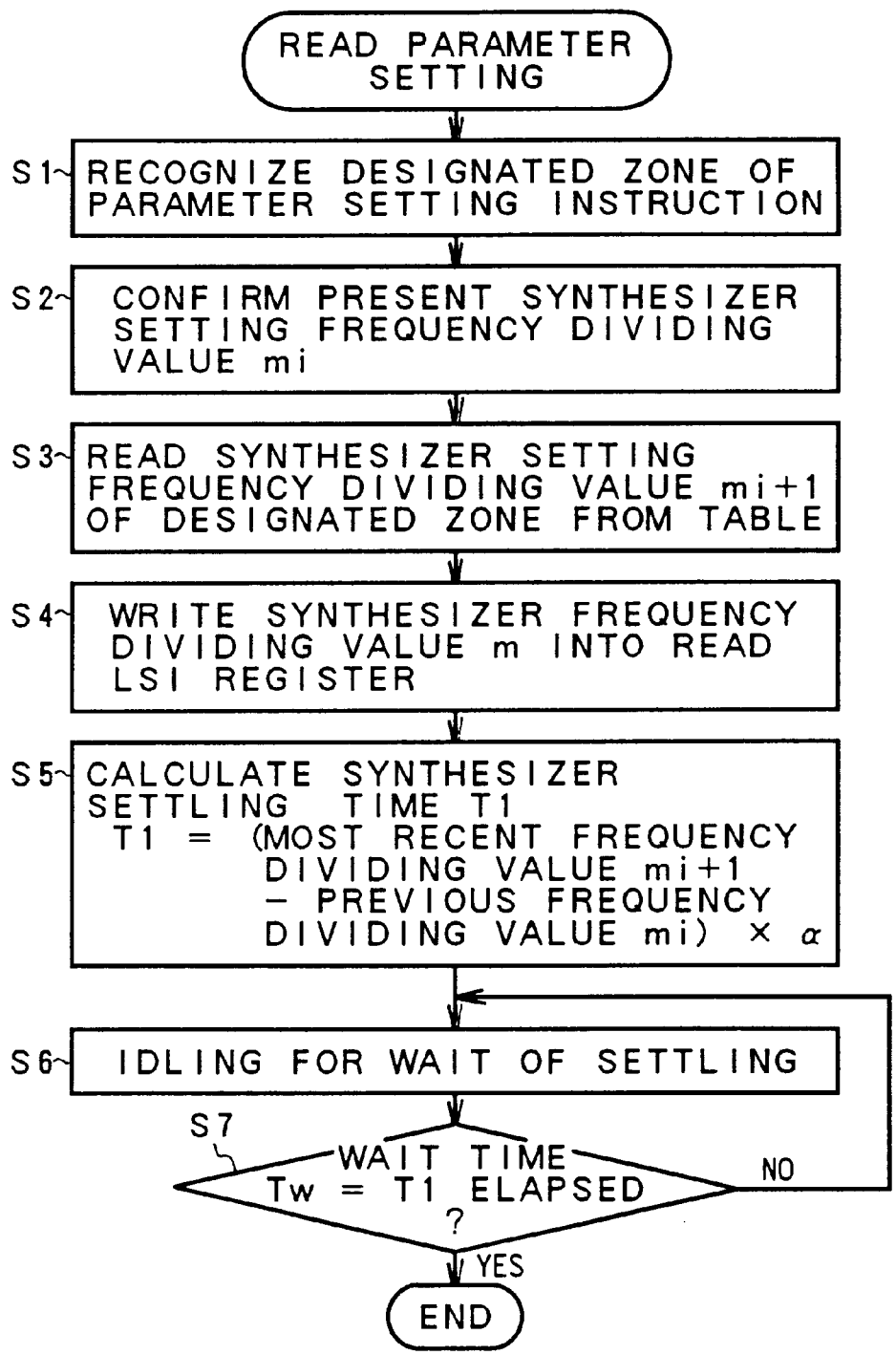

STORAGE APPARATUS USING VARIABLE READ CLOCK FREQUENCIES FOR READING ZCAV RECORDING MEDIUM

BACKGROUND OF THE INVENTION

1. Field of the Invention

The present invention relates generally to a storage apparatus in which when reading a zone constant angular velocity (ZCAV) recorded medium, a read clock frequency is variably controlled in response to zones of the medium, and more particularly to a storage apparatus having a frequency synthesizer in which are set frequency dividing ratios corresponding to the medium zones, to optimize a wait control of settling time required for the varied frequency to become stabled.

2. Description of the Related Art

Magneto-optic disk media known as MO cartridges commercially available at present include 128 MB, 230 MB, 540 MB and 640 MB media and direct overwritable 230 MB, 540 MB and 640 MB media. Among them, the 230 MB, 540 MB and 640 MB media employ the ZCAV recording while the 128 MB medium having a single zone employs mere CAV recording.

For the ZCAV recording, a medium data area is radially divided into a plurality of zones, with the outer zones having higher recording frequencies. When reading data from a ZCAV recorded medium by means of an optical disk drive, it is therefore necessary to vary a reference clock frequency depending on a target zone. Setting of this reference clock is usually effected by a frequency synthesizer using a PLL within a data read only LSI called a read LSI. More specifically, an externally generated clock of a frequency fi is fed to the frequency synthesizer, in which a frequency dividing ratio (m/n) is set using two digital values m and n received from an MPU, to output a reference clock having a frequency fo given as $$fo = (m/n) \, fi$$

When reading zone-to-zone data, it is further necessary in addition to the setting of the frequency synthesizer to set other parameters such as a filter cut-off frequency. Such setting is also effected by writing digital values into the read LSI.

In such a conventional optical disk drive, however, when the MPU sets a frequency dividing ratio in the frequency synthesizer of the read LSI to thereby vary the frequency, time is required for a reference clock to become stabilized at a target frequency after writing the frequency dividing value into the read LSI. This time is usually called settling time. The settling time is proportional to a variation in the frequency dividing ratio to be set. An execution of read processing with an unstable reference clock frequency generated from the frequency synthesizer may bring about an error, so that any processing must be stood by until the reference clock becomes settled. Up till now, in order to determine this settling wait time, the frequency dividing ratio of the frequency synthesizer is varied to its maximum within a frequency range necessary for the medium, to actually measure the settling time at that time. The thus measured maximum settling time is uniformly set as a wait time after the setting of the frequency dividing ratio in the frequency synthesizer. For this reason, even in the case of less amount of zone-to-zone movement, the maximum settling time corresponding to the medium frequency range is employed as the wait time, resulting in an vain wait in spite of actual settling, so that data transfer to the host apparatus may be apparently decelerated.

SUMMARY OF THE INVENTION

According to the present invention, there is provided a storage apparatus capable of increasing the speed of data transfer to a host apparatus, by eliminating vain time in a settling time when varying the frequency of a frequency synthesizer upon the read of a ZCAV recorded medium.

The storage apparatus of the present invention comprises a frequency synthesizer, a setting control unit and a settling wait unit. Through the setting of a frequency control value, the frequency synthesizer generates a reference clock having a frequency necessary for data read from a medium. When reading data from an arbitrary position on a disk medium which is radially divided into a plurality of zones and is rotated at a constant angular velocity, the setting control unit sets a predetermined frequency control value corresponding to a read position on the medium in the frequency synthesizer so as to allow a control of the reference clock frequency, and sets a predetermined control value corresponding to the read position on the medium in a single or a plurality of processing units other than the frequency synthesizer. The settling wait processing unit renders migration to the subsequent processing waiting during a wait time obtained by subtracting a setting processing time necessary for the setting control of the processing units other than the frequency synthesizer from a settling time required, after setting the frequency control value in the frequency synthesizer, to become stabilized at a frequency corresponding thereto. According to the present invention in this manner, time proportional to a variance in the setting value for the frequency synthesizer is employed as a wait time required for the frequency synthesizer to become settled, so that the wait time is approximated to the settling time required for the frequency to become stable in the actual frequency synthesizer, thereby making it possible to suppress vain time in the wait time to a minimum. Due to the fact that there is also performed simultaneous setting of parameters corresponding to a zone to which the target track belongs, for the other processing units than the frequency synthesizer, the wait time can further be reduced by employing as the actual wait time Tw a value (T1−T2) obtained by subtracting the processing time T2 for the other processing units from the settling time T1. Thus, by approximating the wait time required for the frequency synthesizer to become settled to the time for the frequency of the actual frequency synthesizer to become stable, it is possible to eliminate any vain wait time and thereby accelerate the data transfer to the host apparatus.

When the settling time T1 is greater than the setting processing time T2 (T1>T2), the settling wait processing unit, keeps migration to the subsequent processing waiting during a wait time Tw=(T1−T2) obtained by subtracting the setting processing time T2 from the settling time T1, whereas when the settling time T1 is equal to or less than the setting processing time T2 (T1≦T2), it sets the wait time Tw to zero permitting migration to the subsequent processing at a time when the setting processing time T2 has elapsed. The settling wait unit calculates the settling time from a difference between the last frequency control value and the current frequency control value, set in the frequency synthesizer by the setting control unit. More specifically, the frequency synthesizer in response to setting of a frequency dividing ratio (m/n) by the setting control unit generates a reference clock having an output frequency fo=(m/n)·fi obtained by multiplying an input clock frequency fi by the frequency dividing ratio (m/n). The setting control unit sets in the frequency synthesizer a frequency dividing ratio (m/n) obtained by dividing a first frequency dividing value m corresponding to the zone position on a medium by a second frequency dividing value n corresponding to the type of the medium. Furthermore, the settling wait processing unit calculates the settling time from a difference between the last and current first frequency dividing values m. The settling wait processing unit may calculate the settling time from a difference between the last read position on the medium and the current read position on the medium. That is, the settling wait processing unit calculates the settling time from a difference between the last read zone position on the medium and the current read zone position on the medium. In this instance, the settling time T1 required for the frequency synthesizer to become settled results in a time proportional to a variation in the medium zone position. In addition to the setting of a frequency control value in the frequency synthesizer, the setting control unit executes setting of a resistance value for selecting a dumping factor of a PLL provided in the frequency synthesizer; setting of a control voltage for controlling an oscillation frequency of a voltage-controlled oscillator provided in the frequency synthesizer, to a predetermined frequency within a frequency range of the medium; setting of a cut-off frequency of an equalizer for equalizing a data signal issued from a detector which has received a return light from a data region in a medium track sector; and setting of a cut-off frequency of a sector mark detection circuit for detecting a sector mark from an ID signal issued from the detector which has received a return light from a medium ID region.

The storage apparatus of the present invention comprises two processors, that is, an MPU and a DSP. In parallel with execution of a seek instruction based on a read command from a host apparatus, the setting control unit and the settling wait processing unit execute setting control and settling wait, respectively, for the frequency synthesizer and the other processing units. When execution of a seek instruction based on a read command from the host apparatus has resulted in a seek error, the setting control unit performs a control of setting corresponding to the error zone for the frequency synthesizer and the other processing units, and allows execution of a retry seek at a time when a wait time by the settling wait processing unit has elapsed. In this instance, the MPU executes processing of the setting control unit and of the settling wait processing unit, and the DSP executes the seek instruction. In the case where the storage apparatus of the present invention includes only the MPU for processing without having the DSP (single processor configuration), the setting control unit and the settling wait processing unit previous to execution of a seek instruction based on a read command from the host apparatus, execute setting control and settling wait processing, respectively, for the frequency synthesizer and the other processing units.

In another mode of the present invention, only the frequency setting control of the frequency synthesizer is carried out upon the data read. More specifically, a frequency synthesizer is provided for generating, through setting of a frequency control value, a reference clock having a frequency necessary to read data from a medium. When reading data from an arbitrary position on a disk medium which is radially divided into a plurality of zones and is rotated at a constant angular velocity, the setting control unit sets a predetermined frequency control value corresponding to the read position in the frequency synthesizer so as to allow a control of the reference clock frequency. The settling wait processing unit calculates a settling time T1 required, after the setting of the frequency control value in the frequency synthesizer, to become stabilized at a corresponding frequency, to thereby render migration to the subsequent processing waiting until the settling time elapses. In this case also, the wait time required for the frequency synthesizer to become settled is approximated to the time required for the frequency of the actual frequency synthesizer to become stabilized so that vain wait time is eliminated to accelerate the data transfer to the host apparatus. The settling wait processing unit calculates the settling time from a difference between the last frequency control value and the current frequency control value, set in the frequency synthesizer by the setting control unit. More specifically, the frequency synthesizer in response to setting of a frequency dividing ratio (m/n) by the setting control unit generates a reference clock having an output frequency fo obtained by multiplying an input clock frequency fi by the frequency dividing ratio (m/n). The setting control unit sets in the frequency synthesizer a frequency dividing ratio (m/n) obtained by dividing a first frequency dividing value m corresponding to the zone position on a medium by a second frequency dividing value n corresponding to the type of the medium. Furthermore, the settling wait processing unit calculates the settling time from a difference between the last and current first frequency dividing values m. The settling wait processing unit calculates the settling time from a difference between the last read position on the medium and the current read position on the medium. That is, the settling wait processing unit calculates the settling time from a difference between the last read zone position on the medium and the current read zone position on the medium.

The above and other objects, features and advantages of the present invention will become more apparent from the following detailed description with reference to the drawings.

BRIEF DESCRIPTION OF THE DRAWINGS

FIGS. 1A and 1B are block diagrams of an optical disk drive in accordance with the present invention;

FIG. 2 is an explanatory diagram of the interior structure of the apparatus loaded with an MO cartridge;

FIG. 5 is an explanatory diagram of zones and clock frequencies for 540 MB and 640 MB media for use in the present invention;

FIG. 6 is an explanatory diagram of a 540 MB medium parameter table provided in an MPU of FIG. 3;

FIG. 7 is an explanatory diagram of a 640 MB medium parameter table provided in the MPU of FIG. 3;

FIGS. 14A and 14B are flow charts of processing of the MPU and DSP when a seek error has occurred in response to a read instruction from the host apparatus;

FIG. 19 is an explanatory diagram of a 640 MB parameter table for use in the embodiment of FIG. 17;

FIGS. 20A to 20C are time charts of FIG. 17 embodiment when the settling time is greater than the parameter setting processing time;

FIGS. 21A to 21C are time charts of FIG. 17 embodiment when the settling time is less than the parameter setting processing time;

FIG. 22 is a flow chart of read parameter setting processing by FIG. 17 embodiment, for calculating a settling time from a variance in frequency dividing values;

DETAILED DESCRIPTION OF THE PREFERRED EMBODIMENTS

Apparatus Configuration

Figure 1B:
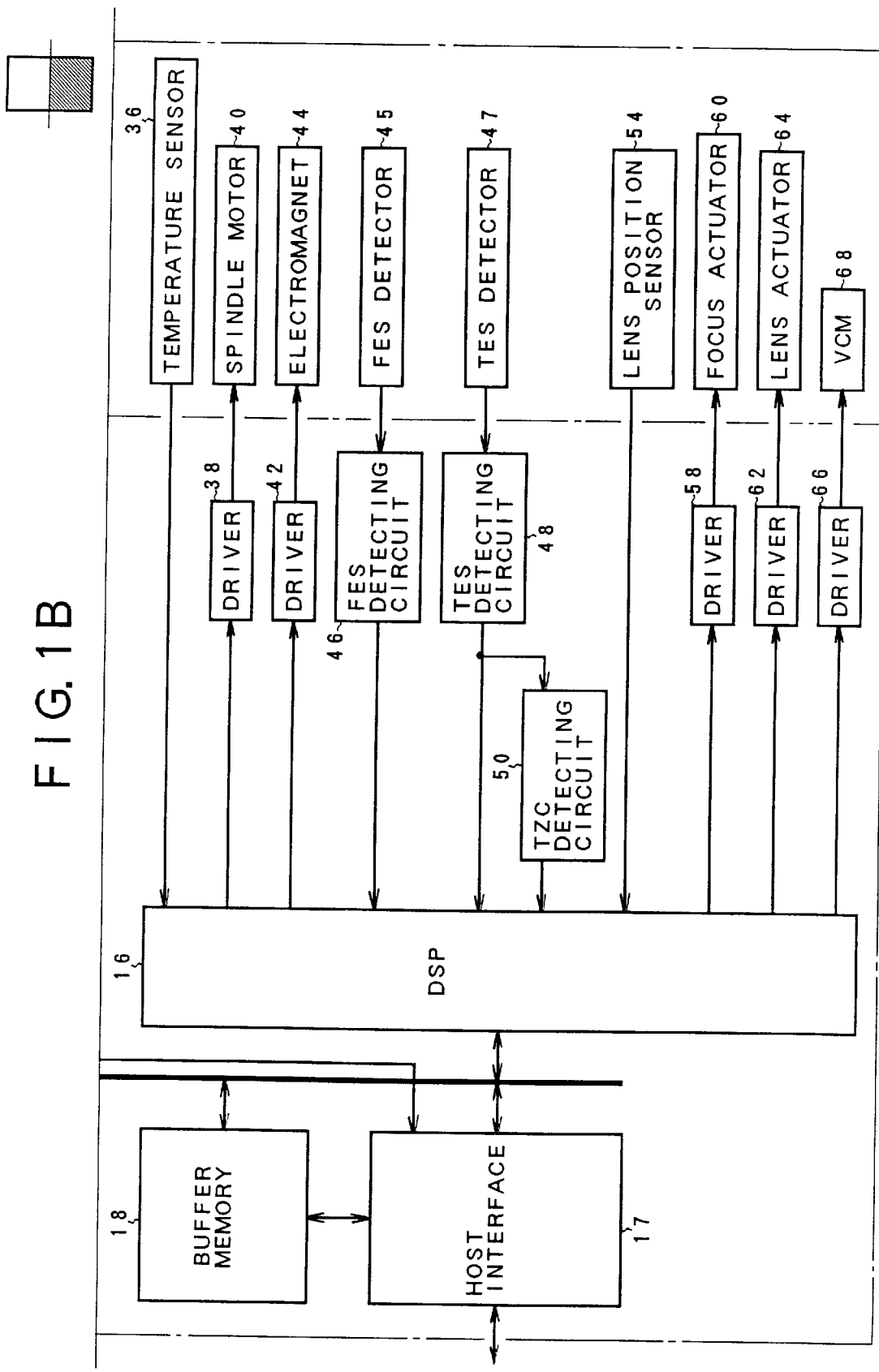

FIG. 1 illustrates by way of example an optical disk drive which is a storage apparatus or optical storage apparatus in accordance with the present invention. The optical disk drive of the present invention is constituted by a control unit 10 and an enclosure 11. The control unit 10 comprises an MPU 12 intended for overall control of the optical disk drive, a host interface 17 for sending/receiving commands and data to/from a host apparatus, an optical disk controller (ODC) 14 intended for processing required to read/write data from/to an optical disk medium, a DSP 16 and a buffer memory 18. The buffer memory 18 is shared among the MPU 12, the optical disk controller 14 and the host interface 17. The optical disk controller 14 includes a formatter 14-1 and an ECC processing unit 14-2. Upon a write access, the formatter 14-1 divides NRZ write data on a medium sector-to-sector basis to generate a record format and the ECC processing unit 14-2 generates an ECC code for each sector write data for adding thereto and if necessary generates a CRC code for adding thereto. The ECC encoded sector data are then converted into for example 1–7RLL codes. Upon a read access, the 1–7RLL codes are inverted to obtain demodulated sector read data, which in turn are fed to the ECC processing unit 14-2 for CRC check and subsequent error detection/correction and then to the formatter 14-1 in which sector-based NRZ data are linked thereto to obtain an NRZ read data stream to be transferred to the host apparatus. The optical disk controller 14 is associated with a write LSI circuit 20, which includes a write modulation unit 21 and a laser diode control circuit 22. A control output of the laser diode control circuit 22 is fed to a laser diode unit 30 provided in an optical unit on the enclosure 11 side. The laser diode unit 30 integrally includes a laser diode 30-1 and a monitor photo detector 30-2. The write modulation unit 21 serves to convert write data into data formats in PPM recording or PWM recording (also called mark recording or edge recording). In this embodiment, 128 MB, 230 MB, 540 MB or 640 MB MO cartridge medium is available as an optical disk on which recording/reproduction is performed by use of the laser diode unit 30, that is, as a writable MO cartridge medium. Among them, the 128 MB and 230 MB MO cartridge media employ a pit position recording (PPM recording) in which data are recorded in response to the presence or absence of markings on the media. The medium recording format is a zone CAV having a user area consisting of a single zone for 128 MB medium and of 10 zones for 230 MB medium. The 540 MB and 640 MB MO cartridge medium allowing a high-density recording employ a pulse width recording (PWM recording) in which data are correlated with marking edges, that is, a front edge and a rear edge of a marking. In this case, a difference in memory capacity between the 640 MB and 540 MB media arises from a difference in sector capacity, so that 2048-bite sector capacity results in 640 MB memory capacity and 512-bite sector capacity results in 540 MB memory capacity. The medium recording format is a zone CAV having a user area consisting of 11 zones for 640 MB and of 18 zones for 540 MB medium. In this manner, the optical disk drive of the present invention is capable of dealing with the 128 MB, 230 MB, 540 MB and 640 MB MO cartridges, including direct overwritable 540 MB and 640 MB MO cartridges. Thus, when the optical disk drive is loaded with an MO cartridge medium, it first reads a medium ID section to recognize a medium type from its pit interval in the MPU 12 and sends the type recognition result to the optical disk controller 14. A read LSI circuit 24 is provided as a read system for the optical disk drive 14 and includes a read demodulation unit 25 and a frequency synthesizer 26. The read LSI circuit 24 receives as an ID signal and an MO signal, via a head amplifier 34, a light receiving signal of a beam return light from the laser diode 30-1 by the ID/MO detector provided in the enclosure 11. The read demodulation unit 25 of the read LSI circuit 24 has functions of circuits such as an AGC circuit, a filter and a sector marking detection circuit. The read demodulation unit 25 generates read clocks and read data from input ID signals and MO signals and demodulates PPM data or PWM data into original NRZ data. As a result of employment of the zone CAV, the MPU 12 controls setting of the frequency dividing ratios for generation of zone-corresponding clock frequencies, for the frequency synthesizer 26 incorporated in the read LSI circuit 24. The frequency synthesizer 26 is a PLL circuit provided with a programmable frequency divider and generates as a read clock a reference clock having a specific frequency previously defined in response to a medium zone position. In other words, the programmable frequency divider 26 is comprised of a PLL circuit with programmable frequency divider and generates a reference clock having a frequency $f_o$ in accordance with a frequency dividing ratio (m/n) which has been set in response to the zone number by the MPU 12, based on $$f_o = (m/n) \cdot f_i \qquad (1)$$

where a frequency dividing value n, which is a denominator of the frequency dividing ratio (m/n), is a value intrinsic to the medium type such as the 128 MB, 230 MB, 540 MB or 640 MB medium, with a frequency dividing value m of the numerator being a value which varies depending on the medium zone position and is previously prepared for each medium in the form of table information on values corresponding to zone numbers. Read data demodulated by the read LSI circuit 24 are fed to the read system of the optical disk controller 14, in which after the 1–7RLL code inversion, the demodulated read data are subjected to the CRD check and the ECC processing by the encode function of the ECC processing unit 14-2 to restore the NRZ sector data. The thus restored NRZ sector data are then linked together for the conversion to an NRZ read data stream by the formatter 14-1 and then transferred via the buffer memory 18 to the host apparatus by the host interface 17.

The MPU 12 receives via the DSP 16 a detection signal from a temperature sensor 36 provided in the enclosure 11. On the basis of an environment temperature of the unit within the apparatus which has been detected by the temperature sensor 36, the MPU 12 controls read, write and erase light emitting powers in the laser diode control unit 22 to their respective optimum values. By means of a driver 38 via the DSP 16, the MPU 12 controls a spindle motor 40 provided in the enclosure 11. Since the recording format of the MO cartridge is the zone CAV, the spindle motor 40 is rotated at a fixed speed of, for example, 300 rpm. By means of a driver 42 via the DSP 16, the MPU 12 controls an electromagnet 44 provided in the enclosure 11. The electromagnet 44 is arranged on the side opposite to the beam irradiation side of the MO cartridge loaded in the apparatus, to apply an external magnetic field to the medium at the time of recording and erasing operations. The DSP 16 has a servo function for positioning a beam from the laser diode 30 on the medium and serves as a seek control unit and on-track control unit for seeking at a target track for on-track. These seek control and on-track control can be simultaneously executed in parallel with a write access or a read access in response to an upper command by the MPU 12. In order to implement the servo function of the DSP 16, the optical unit on the enclosure 11 side includes an FES detector 45 for detecting a beam return light from the medium. An FES detection circuit (a focus error signal detection circuit) 46 generates a focus error signal E1 from a detection output of the FES detector 45 and sends it to the DSP 16. The optical unit on the enclosure 11 side further includes a TES detector 47 for detecting a beam return light from the medium. A TES detection circuit (a tracking error signal detection circuit) 48 generates a tracking error signal E2 from a detection output of the TES detector 47 and sends it to the DSP 16. The tracking error signal E2 is provided as input to a TZC detection circuit (a track zero-cross detection circuit) 50, which generates a track zero-cross pulse E3 and sends it to the DSP 16. The enclosure 11 further includes a lens position sensor 54 for detecting a lens position of an objective lens through which a laser beam is applied to the medium. The lens position sensor 54 generates a lens position detection signal (LPOS) E4 and sends it to the DSP 16. In order to control a beam spot position on the medium, the DSP 16 controllably drives a focus actuator 60, a lens actuator 64 and a VCM 68 by way of drivers 58, 62 and 66, respectively.

FIG. 2 illustrates a schematic configuration of the enclosure 11 in the optical disk drive. The spindle motor 40 is accommodated in a housing 67 and has a rotary shaft hub onto which an MO cartridge 70 is loaded through an inlet door 69 so that an MO medium 72 inside the cartridge 70 is fitted on the rotary shaft hub of the spindle motor 40. Under the thus loaded MO cartridge 70 containing the MO medium 72 is disposed a carriage 76 which can be freely moved in the direction across medium tracks by means of the VCM 68. On the carriage 76 is mounted an objective lens 80 which receives through a beam uprighting mirror 82 a beam from a laser diode provided in a fixed optical system 78 and forms a beam spot on a medium surface of the MO medium 72. The objective lens 80 is so controlled as to be movable in the optical axial direction by the focus actuator 60 provided in the enclosure 11 of FIGS. 1A and 1B and is allowed to move by the lens actuator 64 in the radial direction across the medium tracks by a distance within, e.g., several tens of tracks. The lens position sensor 54 of FIG. 1B detects a position of the objective lens 80 mounted on the carriage 76. The lens position sensor 54 sets a lens position detection signal to zero at a neutral position at which the optical axis of the objective lens 80 is directed vertically upward and issues a lens position detection signal E4 of different polarities in response to the amount of movement to the outer side or inner side.

Read LSI Plural Parameters Setting Control and Settling Wait

Figure 3:
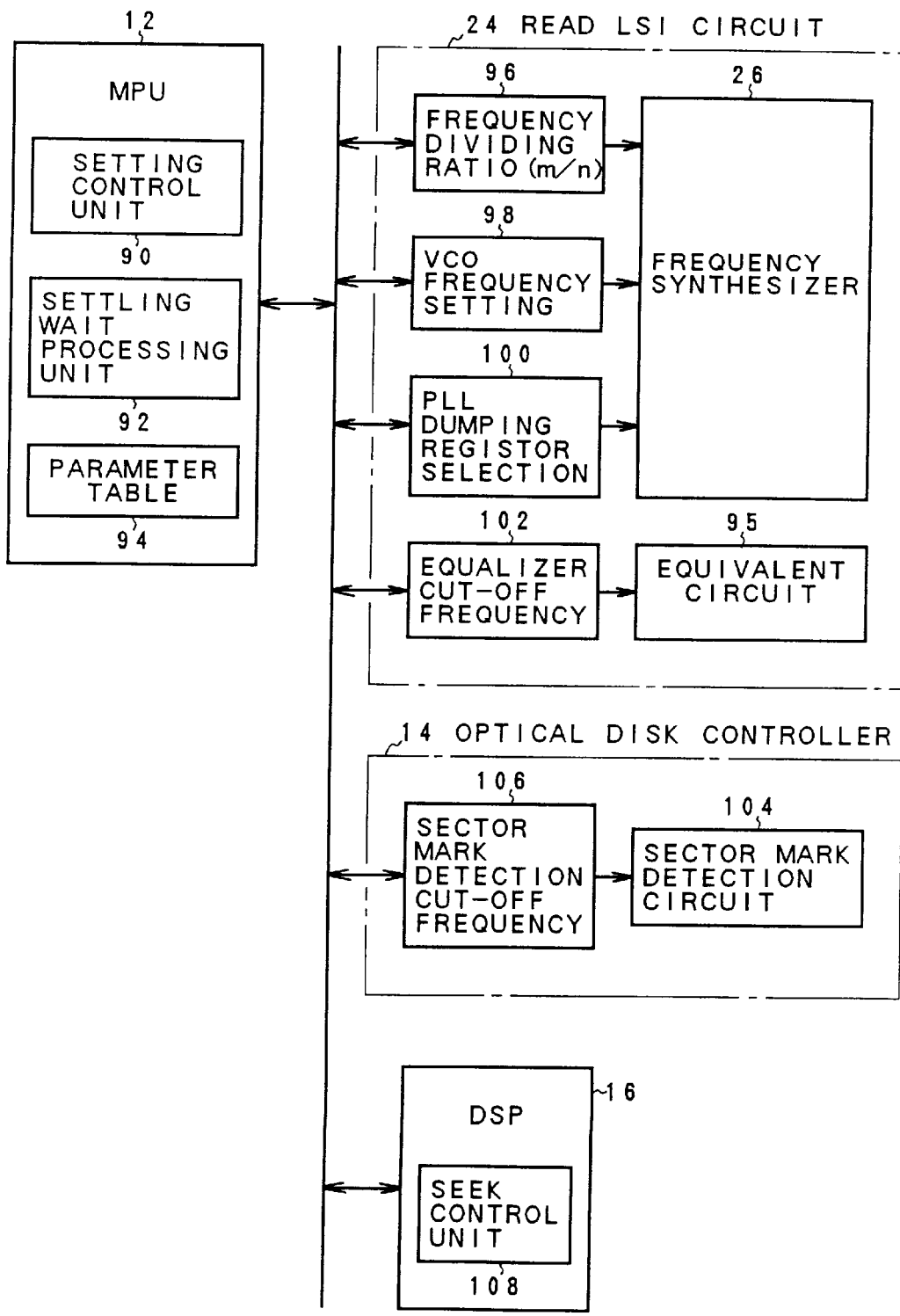
FIG. 3 is a functional block diagram of parameter setting control and settling wait in accordance with the present invention.

FIG. 3 is a functional block diagram of parameters setting control and settling wait in accordance with the present invention, for the read LSI circuit 24, optical disk controller 14 and DSP 16, executed by the MPU 12 in the optical disk drive of FIGS. 1A and 1B. The MPU 12 includes a parameters setting control unit 90 operable in response to a read command from the host apparatus and a post-parameter-setting settling wait processing unit 92. The setting control unit 90 provides a control of setting of parameters required for various utilization accesses using a parameter table 94 developed within, e.g., a RAM. As objects to be parameter set by the setting control unit 90 provided in the MPU 12, the read LSI circuit 24 includes a frequency synthesizer 26 and an equivalent circuit 95 for MO signals derived from the photo detector. In this embodiment, the frequency synthesizer 26 is associated with three control registers 96, 98 and 100. Within the control registers 96, 98, 100, the setting control unit 90 of the MPU 12 sets parameters of frequency dividing ratio (m/n), VCO frequency setting and PLL dumping resistor selection, respectively. The equivalent circuit 95 is associated with a control register 102 in which an equalizer cut-off frequency is set by the setting control unit 90 of the MPU 12. A sector mark detection circuit 104 provided in the optical disk controller 14 is associated with a control register 106 in which a sector mark detection cut-off frequency is controllably set by the setting control unit 90 of the MPU 12. When the MPU 12 executes a read command from the host apparatus, the DSP 16 receives a seek instruction transferred thereto, on the basis of which seek instruction a seek control unit 108 executes a seek control for positioning a beam spot onto a target track simultaneously and in parallel with the processing of the MPU 12.

Figure 4:
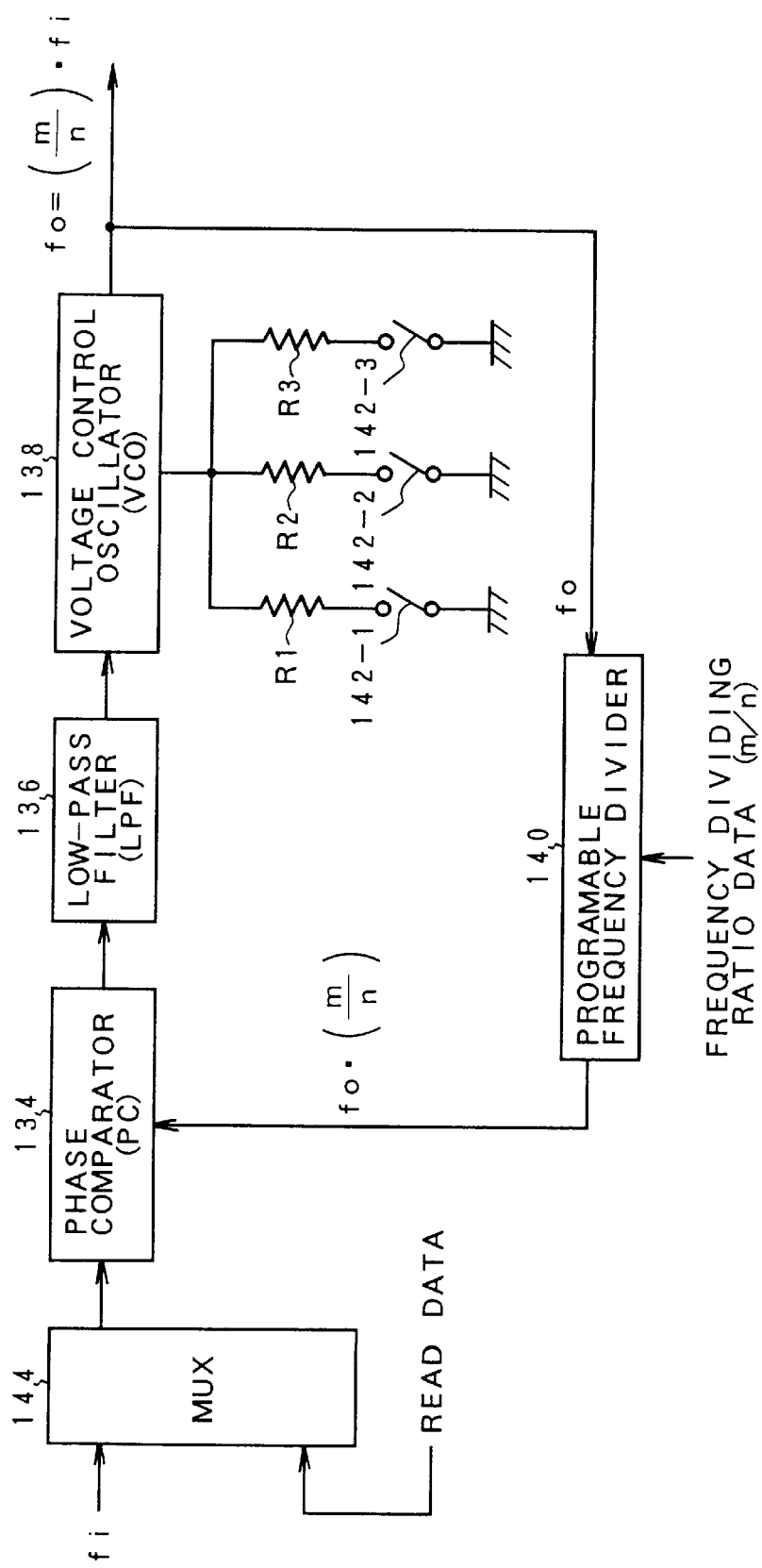
FIG. 4 is a block diagram of a frequency synthesizer of FIG. 3.

FIG. 4 is a block diagram of the frequency synthesizer 26 provided in the read LSI circuit 24 of FIG. 3. The frequency synthesizer 26 comprises a phase comparator 134, a low-pass filter 136, a voltage control oscillator 138 and a programmable frequency divider 140. The phase comparator 134 receives via a multiplexer 144 a reference clock having a frequency fi generated in an external circuit and performs a phase comparison between the frequency fi and a frequency fo·(m/n) of a frequency dividing clock of the programmable frequency divider 140. The multiplexer 144 receives a reference clock having a frequency fi upon the parameter setting instruction based on a read command and is switched to receive read data upon the completion of seek, namely, a positioning onto a target track for on-track. An output of the phase comparator 134 is cleared of its high-frequency components by the low-pass filter 136 and then is fed to the voltage control oscillator 138, which produces a reference clock having a frequency fo. The oscillation frequency fo of the reference clock is given as the expression (1). By setting the frequency dividing ratio data (m/n) by means of the MPU, the programmable frequency divider 140 is capable of having an arbitrarily adjusted reference clock oscillation frequency fo. In the frequency dividing ratio data (m/n) for the programmable frequency divider 140, the frequency dividing value n of the numerator is a value specific to each of 123 MB, 230 MB, 540 MB and 640 MB media, whereas the frequency dividing value m of the denominator is a value varying depending on zone numbers in each medium. In the case of the 540 MB and 640 MB media by way of example, the clock frequencies for the medium zones are shown in FIG. 5.

As is apparent from FIG. 5, the 540 MB medium comprises a data zone serving as a user zone between an inner read-in zone and an outer read-out zone, the data zone consisting of 18 zones designated at zone Nos. 0 to 17. The read-in zone consists of an initial zone, a learning zone, a test zone, a control zone and a buffer zone. The read-out zone consists of a test zone and a buffer zone. In contrast with such a 540 MB medium whose one sector contains 512 bytes, the 640 MB medium whose one sector contains 2048 bytes comprises a data zone consisting of 11 zones designated at zone Nos. 0 to 10, between a read-in zone and a read-out zone which are identical to those of the 540 MB medium. The clock frequencies of the zone Nos. 0 to 17 of the 540 MB medium data zone are defined as 540 MB clock frequency f=(50+2×zone No.)×(778: byte count per sector)×(12: channel bit count per byte)×(number of revolutions rpm/60) (2)

In the case of 1–7RLL recording mode, the channel bit count per byte results in 1.5 [channel/bit], so that a relation 1 byte=8 bits×1.5 [channel/bit]

is established. If the number of revolutions of the medium is e.g., 3000 rpm, the clock frequency f of the zone 0 having the zone No.=0 can be obtained as follows.

f=50×778×12×3000 rpm/60=23.34 MHz

By placing the zone Nos. 1 to 17 into the expression (2) in the same manner, there can be obtained clock frequencies 24.27 MHz to 39.21 MHz shown in the zones 1 to 17. It is to be noted that the innermost read-in zone has a clock frequency 22.41 MHz obtained when decreasing one zone from the zone 0, and that the outermost read-out zone uses the clock frequency 39.21 MHz identical to that of the data zone 17. The clock frequencies of the 640 MB medium are defined as 640 MB clock frequency f=(15+zone No.)×(2584: byte count per sector)×(12: channel bit count per byte)×(number of revolutions rpm/60) (3)

If the number of revolutions of the medium is e.g., 3000 rpm, the clock frequency of the data zone having the zone No. 0 can be obtained as follows.

f=15×2584×12×3000 rpm/60=23.26 MHz

For the 640 MB medium as well, the innermost read-in zone uses a clock frequency 21.71 MHz obtained when decreasing one zone from the zone 0 and the outer most read-out zone uses a clock frequency 38.76 MHz identical to that of the data zone 10. The clock frequencies for the zones of the 540 MB and 640 MB media shown in FIG. 5 are prescribed in ISO/IEC DIS 15041.

FIG. 6 illustrates a 540 MB medium parameter table 94-1 constituting part of the parameter table 94 provided in the MPU 12 of FIG. 3, for controlling the setting of the clock frequencies corresponding to the zone positions in the 540 MB medium data zone of FIG. 5. Stored in the 540 MB parameter table 94-1 are a frequency dividing value (denominator) n, which is a fixed value, and frequency dividing values (numerators) m00 to m17 for setting the frequency dividing ratios (m/n) in the programmable frequency divider 140 provided in the frequency synthesizer 26 of FIG. 4, correspondingly to 18 different zones designated at zone Nos. 00 to 17.

FIG. 7 illustrates a 640 MB parameter table 94-2 applicable to the 640 MB medium of FIG. 5. Stored therein are a frequency dividing value (denominator) n, which is a fixed value common to the media, and frequency dividing values (numerators) m00 to m11 varying from zone to zone, for setting the frequency dividing ratios (m/n) in the programmable frequency divider 140 provided in the frequency synthesizer 26, correspondingly to 11 different zones designated at zone Nos. 00 to 10.

As parameters other than the frequency dividing ratios (m/n) in the control register 96 for the synthesizer 26, directed to the read LSI circuit 24 of FIG. 3, this embodiment executes the VCO frequency setting and the PLL dumping resistor selection in the control registers 98 and 100, respectively. The VCO frequency setting in the control register 98 will first be described. In order to cause a frequency of a data signal read out from the medium to be identical to a reference clock frequency, an oscillation frequency of the data unit is set in the voltage control oscillator 138 so as to be closer to the frequency of the zone reference clock, thereby allowing an operation to draw the error of the frequency by means of the PLL.

The PLL dumping resistor selection in the control register 100 will then be described. The PLL voltage control oscillator 138 provided in the frequency synthesizer 26 of FIG. 4 is externally associated with dumping resistors R1, R2 and R3 which are selectively connectable by means of analog switches 142-1 to 142-3. These dumping resistors R1, R2 and R3 serve to allow a selection of a dumping factor ζ for ensuring a stable settling of the PLL drawing toward a target frequency upon a change in setting of a frequency dividing ratio to be imparted to the programmable frequency divider 140.

Figure 8:
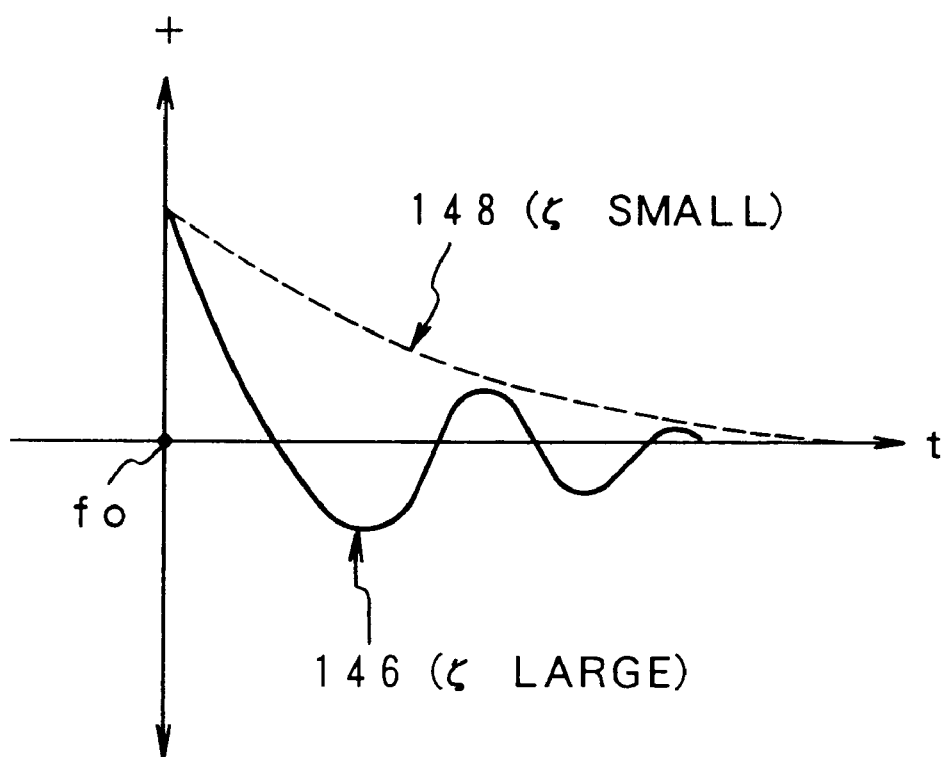
FIG. 8 is an explanatory diagram of dumping characteristics in an oscillation frequency control by the selection of resistors of FIG. 4.

FIG. 8 is an explanatory view of dumping characteristics obtained when the oscillation frequency is settling toward the target frequency upon a change in setting of the frequency dividing ratio by means of the PLL of the frequency synthesizer 26 of FIG. 4. A solid characteristic 146 is obtained when the dumping factor ζ is large and a broken characteristic 148 is obtained when the dumping factor ζ is small. When the dumping factor ζ is large, as can be seen from the characteristic 146, the settling time is shortened but hunting occurs, resulting in a lack of stability. On the contrary, when the dumping factor ζ is small, as can be seen from the characteristic 148, a stable drawing toward the target frequency is ensured but the settling time is elongated. For such a PLL dumping characteristic upon the drawing toward the target frequency, PLL dumping resistor selection information is set in the control register 100 so that any one of the analog switches 142-1 to 142-3 is closed to provide a connection to any one of the dumping resistors R1 to R3, thereby enabling an optimum value of the dumping factor ζ to be set.

Then, the setting control unit 90 provided in the MPU 12 of FIG. 3 is capable of optimizing, through the control of setting of the control register 102, a cut-off frequency of the MO signal equivalent circuit 95 provided in the read LSI circuit 24. Through the control register 106, optimization is further achieved of a cut-off frequency of the sector mark detection circuit 104 provided in the optical disk controller 14.

Figure 9:
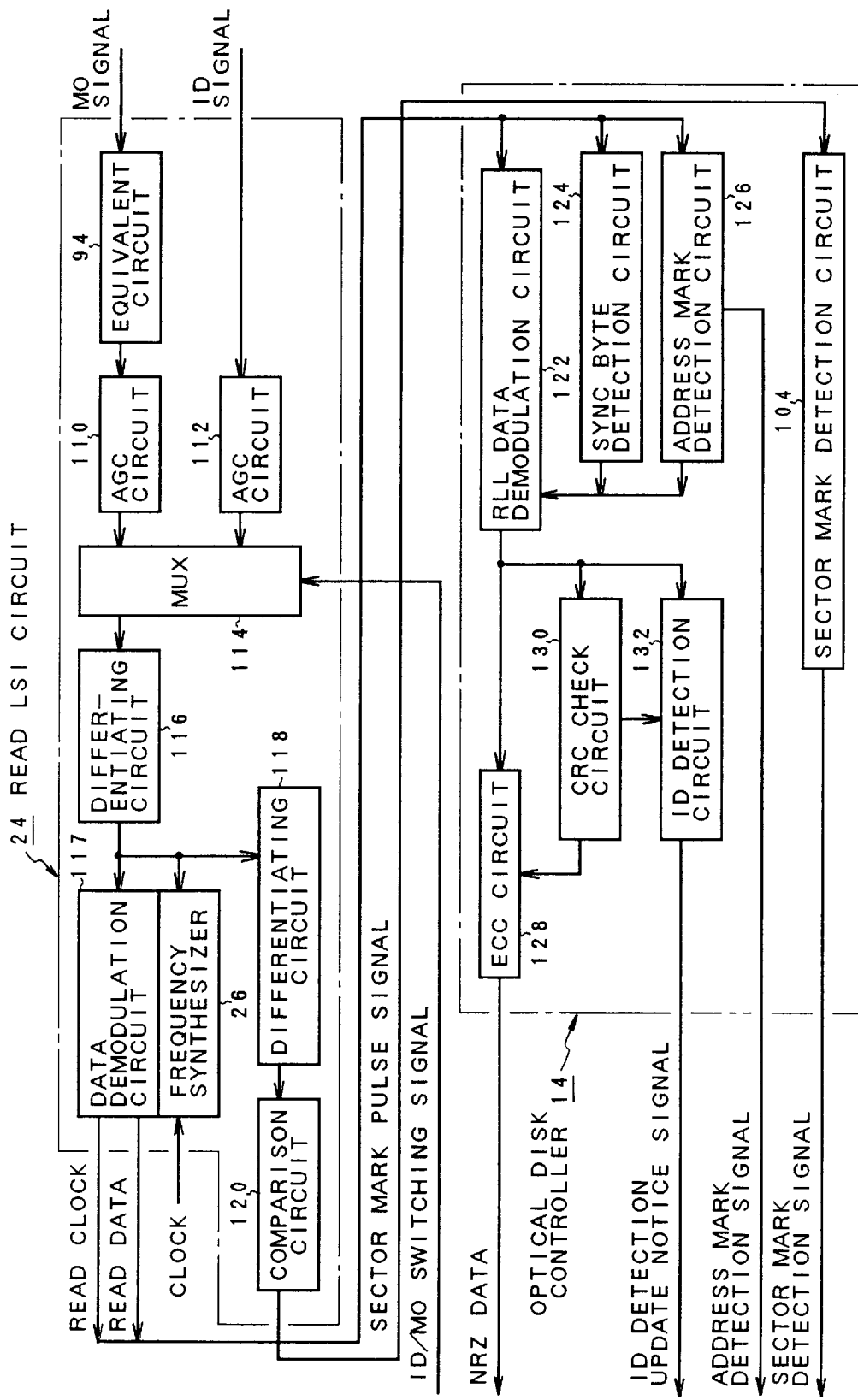
FIG. 9 is a block diagram of a read system in a read LSI circuit and optical disk controller of FIG. 1.

FIG. 9 is a block diagram of a read system in the read LSI circuit 24 and the optical disk controller 14 of FIG. 3. The read LSI circuit 24 receives an MO signal (data signal) and an ID signal from the optical detector which has received a medium return light. The MO signal is subjected to a waveform equalization by an equivalent circuit 94 and then amplified by an AGC circuit 110, whereas the ID signal is amplified by an AGC circuit 112. The setting control unit 90 of the MPU 12 of FIG. 3 optimizes the MO signal equivalent circuit 94 by setting an equalizer cut-off frequency in the control register 102 in response to the zone positions. Outputs of AGC circuits 110 and 112 associated with the MO and ID signals, respectively, are fed to a multiplexer 114 in which one of them is selected by an ID/MO switching signal from the MPU. The thus selected signal is fed sequentially to a differentiating circuit 116 in which a peak level is detected by the zero-crossing. An output of the differentiating circuit 116 is fed to a data demodulation circuit 117 for generating read clocks and read data. The frequency synthesizer 26 generates a target reference clock frequency in response to the setting of a frequency dividing ratio corresponding to a zone ratio of the target track in e.g., seek operation during which no ID signal or MO signal is obtained, and upon a completion of seek for on-track generates a reference clock following a peak detection pulse of the ID signal or the MO signal from the differentiating circuit 116. The data demodulation circuit 117 generates read data which are obtained by synchronizing an ID signal and MO signal obtained in the on-track state after the completion of seek with a read clock generated by the frequency synthesizer 26. At that time, the data demodulation circuit 117 demodulates PPM modulation data or PWM modulation data obtained as read data into pre-modulation read data. An output of the differentiating circuit 116 is further differentiated by a differentiating circuit 118 and then fed to a comparison circuit 120 in which it is compared with a predetermined threshold level to issue a sector mark pulse signal indicative of a sector mark recorded in the ID region. The read system for the optical disk controller 14 comprises an RLL data demodulation circuit 122, a sync-bite detection circuit 124, an address mark detection circuit 126, an ECC circuit 128, a CRC check circuit 130, an ID detection circuit 132 and a sector mark detection circuit 104. The read data and read clocks demodulated by the read LSI circuit 24 are fed to the RLL data demodulation circuit 122, the sync-byte detection circuit 124 and the address mark detection circuit 126. First obtained sector foremost ID signal read data are subjected to a sync-byte detection by the sync-byte detection circuit 124 and then to an address mark detection by the address mark detection circuit 126. The resultant data are fed to the RLL data demodulation circuit 122 in which the read data of the data section (MO section) following the ID section are identified to demodulate the read data through the 1–7RLL inversion. The read data demodulated by the RLL data demodulation circuit 122 are then fed to the ECC circuit 128, the CRC check circuit 130 and the ID detection circuit 132. The CRC check circuit 130 detects an error in a (data+ECC) data stream and provides its result to the ECC circuit 128. On the basis of an ECC code, the ECC circuit 128 performs error detection and correction of the read data for the output as MRZ data. The ID detection circuit 132 detects read data ID information and provides as its output an ID detection update post signal. The address mark detection circuit also provides an address mark detection signal as its output to the MPU 12, and the sector mark detection circuit 104 provides a sector mark detection signal as its output to the MPU 12. Associated with such a sector mark detection circuit 104 provided in the read system for the optical disk controller 14 is the control register 106 of FIG. 3 whose cut-off frequency is controllably set in response to the zone positions by means of the setting control unit 90 provided in the MPU 12, to optimize the cut-off frequency characteristics of the sector mark detection circuit 104.

In order to make it possible to provide controllable setting for the other processing units other than the setting of frequency dividing values for the frequency synthesizer 26 through the setting control unit 90 by the MPU 14 of FIG. 3, the parameter table 94 provided in the MPU 12 contains respective setting information on the VCO frequency, dumping resistor, EQ cut-off frequency and SM cut-off frequency, previously registered correspondingly to the zone Nos. 00 to 17, as in e.g. the 540 MB parameter table 94-1 of FIG. 6. Similarly, the 640 MB parameter table 94-2 of FIG. 7 contains not only the frequency dividing values for the frequency synthesizer 26 but also VCO frequency, dumping resistor, EQ cut-off frequency and SM cut-off frequency, previously registered correspondingly to the zone Nos. 00 to 10.

Description will now be made of the function of the settling wait processing unit 92 provided in the MPU 12 of FIG. 3. When performing a change in setting of the oscillation frequency of the frequency synthesizer 26 by setting in the control register 96 provided in the read LSI circuit 24, through the setting control unit 90 of the MPU 12, a frequency dividing ratio (m/n) corresponding to the number of a zone to which the target track belongs upon the reception of a read command from the host apparatus, a settling time as shown in e.g., FIG. 10 is required for the frequency synthesizer 26 to become settled at the target frequency based on the frequency dividing ratio.

Figure 10:
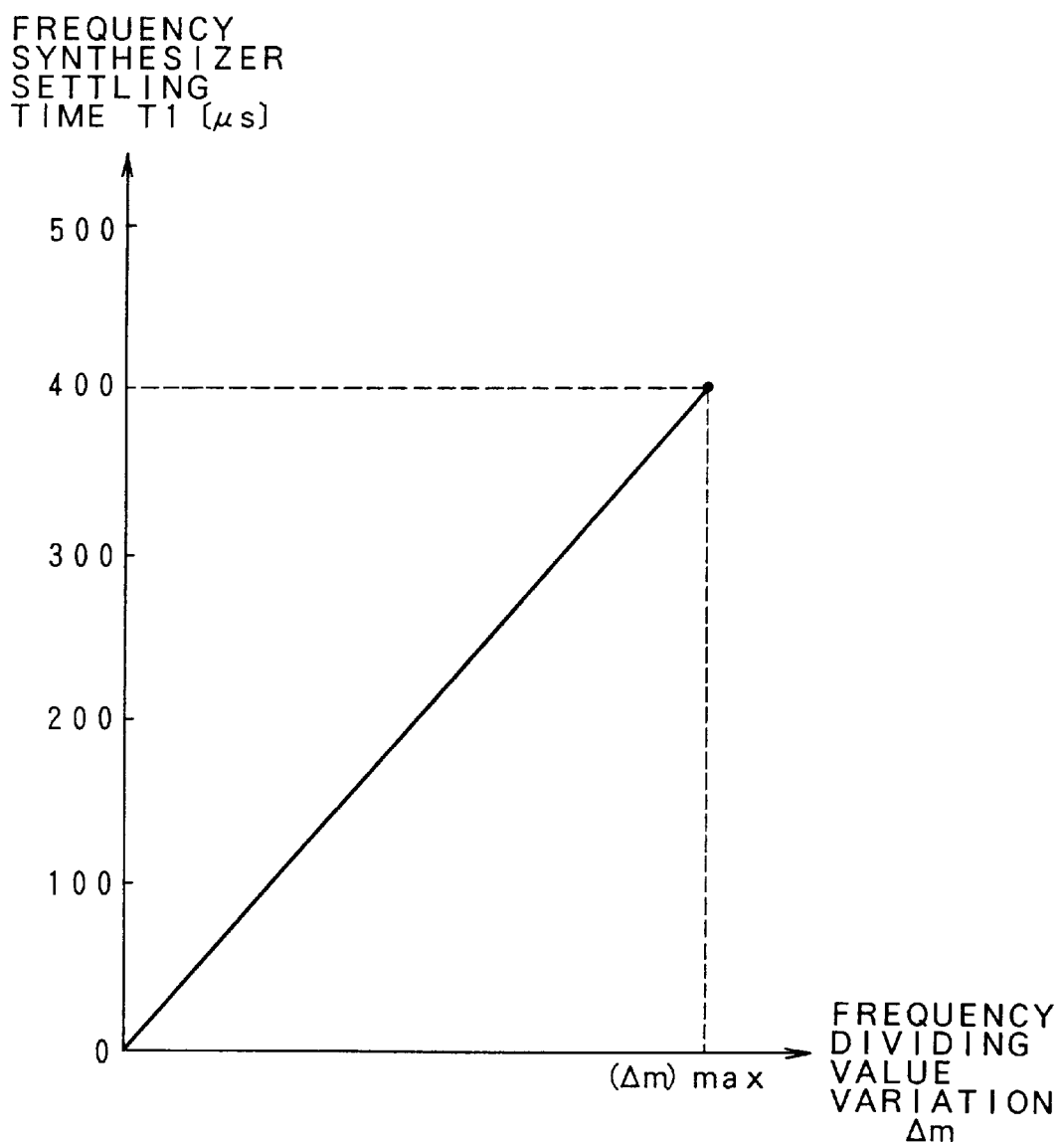
FIG. 10 is a characteristic diagram of variations in frequency dividing values and settling time calculated by a settling wait processing unit of FIG. 3.

In FIG. 10, the axis of abscissas represents a variation $\Delta m$ of the frequency dividing value m and the axis of ordinates represents a settling time T1 required for the frequency synthesizer 26 to become settled at a target frequency. In the case of the 540 MB medium, for instance, the maximum variation $(\Delta m)max$ of the frequency dividing value is given as $\Delta m = n17 - n00$, when the zone position varies the zone No. 00 to No.17 as in FIG. 6, which results in, e.g., 400 μs of settling time. From such a relationship, a linear approximation is achieved of a relation of the settling time T1 relative to the variation $\Delta m$ of the frequency dividing value corresponding to the zone positions. Hence, let α be an inclination of the linear approximation, the settling time T1 relative to the variation $\Delta m$ of the frequency dividing value can be given definitely as $$T1 = \alpha \times \Delta m$$

More specifically, let mi be a former frequency dividing value which is currently set, and let mi+1 be a new frequency dividing value corresponding to a zone of a target track which has been newly set, the synthesizer settling time T1 can be defined as T1=(new frequency dividing value mi+1−former frequency dividing value mi)×α

In the embodiment of FIG. 3, the setting control unit 90 of the MPU 12 provides not only a control of setting into the control register 96 of the frequency dividing ratios for the frequency synthesizer 26, but also a sequential control of setting into the control registers 98, 100, 102 and 106 of values corresponding to the zone positions read out from the parameter table 94. Thus, let T21, T22, T23 and T24 be time required for the control of setting into the control registers 98, 100, 102 and 106, respectively, the setting processing time T2 for the other control registers is given as

T2=T21+T22+T23+T24

This setting processing time T2 for the other control registers is of the order of, e.g., T2=70 µs.

Figure 11:
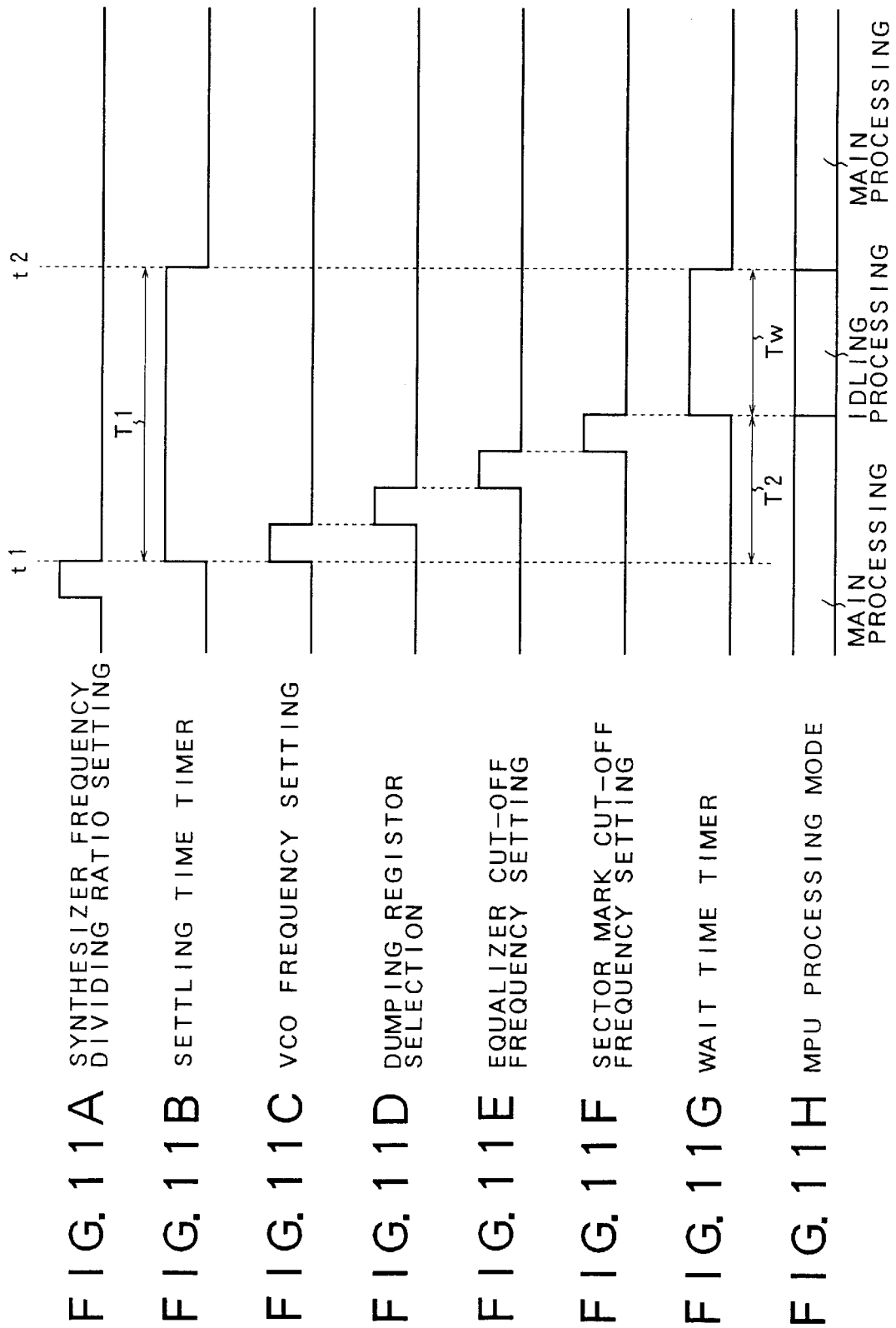
FIGS. 11A to 11H are time charts of the processing of FIG. 3 when the settling time is greater than the parameter setting processing time.

FIGS. 11A to 11H are time charts of parameter setting control executed by the setting control unit 90 of the MPU 12 of FIG. 3, and of settling wait processing executed by the settling wait processing unit 92. Now assuming as in FIG. 11A that setting into the control register 96 of a frequency dividing ratio for the frequency synthesizer 26 has been completed at time t1, the settling time T1 is calculated in conformity with the characteristics of FIG. 10, based on a variation Δm of the frequency dividing value at that time, as seen in the settling time timer of FIG. 11B. Then, the control registers 98, 100, 102 and 106 are successively subjected to the VCO frequency setting, dumping resistor setting, equalizer cut-off frequency setting and sector mark cut-off frequency setting, respectively, as in FIGS. 11C, 11D, 11E and 11F, respectively. The setting processing time required for these procedures results in T2. If in this case the settling time T1 varying depending on a variation of the frequency dividing ratio is greater than the setting processing time T2 fixedly determined by the number of the registers provided, the wait time Tw to be set by the wait time timer as in FIG. 11G is given as Tw=T1−T2

During this wait time Tw by the wait time timer, the MPU is placed in its wait state for idling processing. After the elapse of the wait time Tw at the time t2, the idle state of the MPU is released, allowing a return to its main processing.

Figure 12:
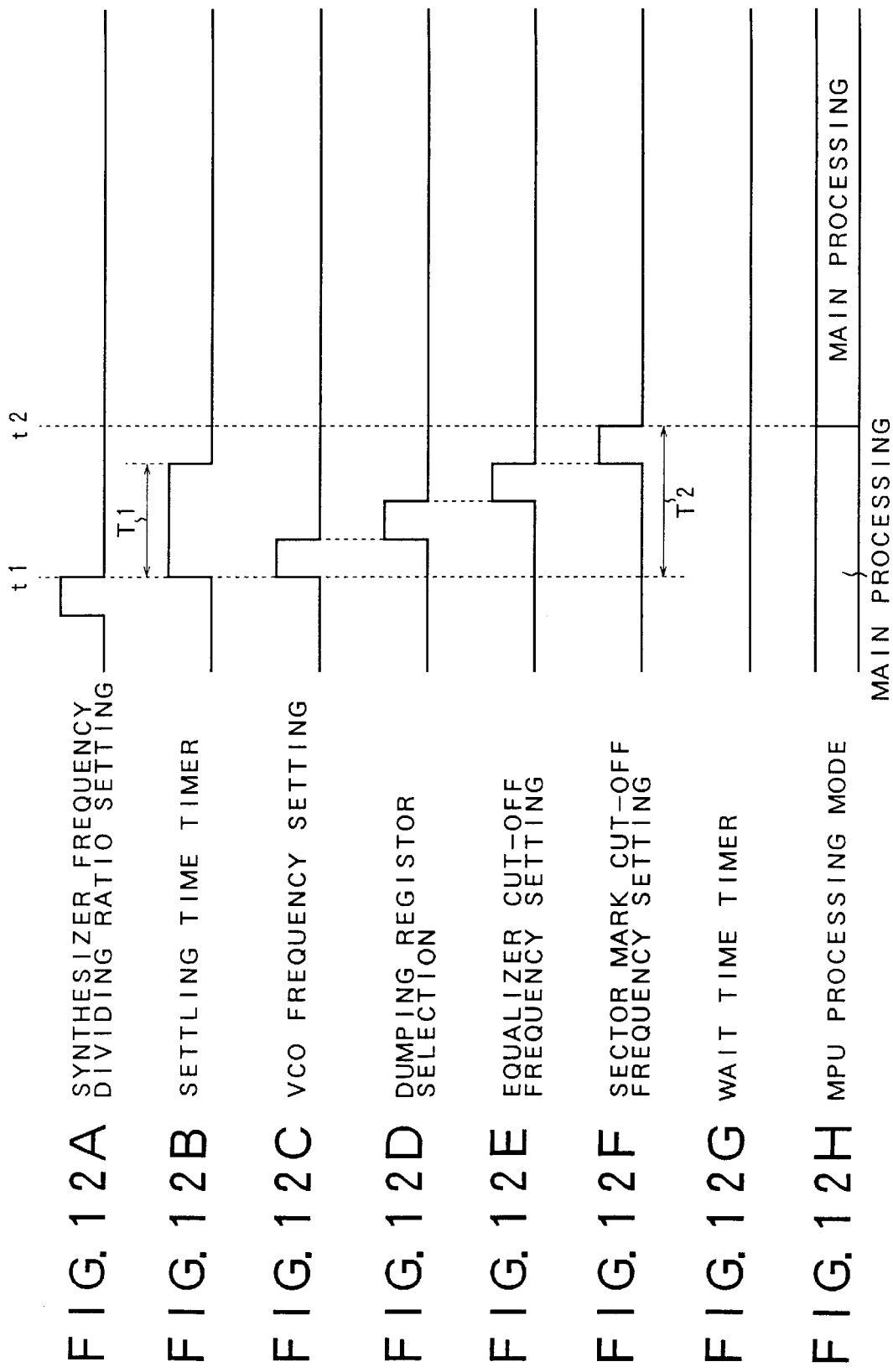
FIGS. 12A to 12H are time charts of the processing of FIG. 3 when the settling time is less than the parameter setting processing time.

FIGS. 12A to 12H illustrate a case where the settling time T1 by the settling time timer of FIG. 12B obtained by the synthesizer frequency setting of FIG. 12A is shorter than total setting processing time for the four registers of FIGS. 12C to 12F. In this case, the settling time T1 is complete previous to the time t2 at which the setting processing time for the registers has elapsed, so that upon a completion of the setting processing time T2 at the time t2 the MPU processing mode is allowed to continue the main processing as in FIG. 12H without being placed in the wait state for the idle processing.

Figure 13:
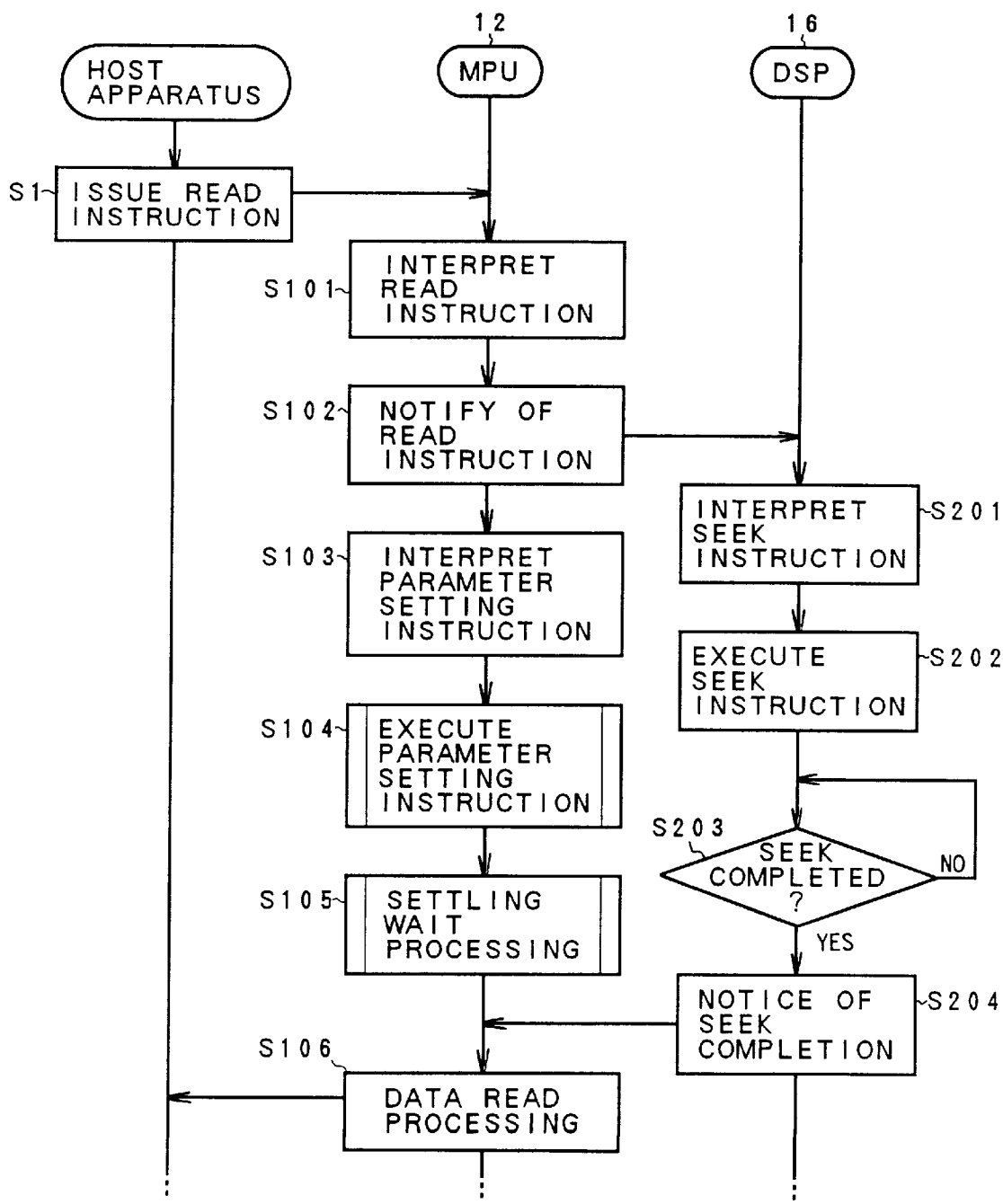
FIG. 13 is a flow chart of processing of the MPU and DSP in response to a read instruction from the host apparatus.

FIG. 13 is a time chart of processing executed by the host apparatus, MPU 12 and DSP 16 in the read access when the MPU 12 receives a read instruction from the host apparatus. When the host apparatus first issues a read instruction at step S1, the MPU 12 receives and interprets the read instruction at step S101 and then posts the DSP 16 on a seek instruction obtained from the result of interpretation of the read instruction at step S102. Upon a reception of a post of the seek instruction from the MPU 12, the seek control unit 108 of FIG. 3 provided in the DSP 16 interprets the seek instruction at step S201 and executes the seek instruction that a beam spot should be positioned at a target track at step S202. After posting the DSP 16 on the seek instruction at step S102, the MPU 12 interprets a parameter setting instruction based on the result of interpretation of the read instruction at step S103, executes the setting control of the values read out in response to the zone numbers from the parameter table 96 for the frequency synthesizer 26 and other processing units by the setting control unit 90 provided in the MPU 12 at step S104, and then performs settling wait processing by the settling wait processing unit 92 at step S105. On the side of the DSP 16 which has executed the seek instruction at step S202, a check is made to see if the seek is complete at step S203, and when an on-track state is achieved by drawing a beam spot onto a target track, the MPU 12 is posted on the seek completion at step S204. In this case, the time required for the execution of the parameter setting instruction and the settling wait processing at steps S104 and S105, respectively, within the MPU 12 does not exceed several hundred µs at most as shown in FIG. 10, whereas the execution of the seek instruction at step S202 by the DSP 16 requires several ms to complete the seeking operation. Accordingly, upon the reception of a post on seek completion from the DSP 16, the MPU 12 has already completed the settling wait processing based on the execution of the parameter setting instruction, so that data read processing is performed at step S106 with the completion of the seeking operation, to transfer the read data to the host apparatus side. In the case where the DSP 16 side has normally completed the seeking operation in response to the read instruction from the host apparatus in this manner, the MPU 12 is not allowed to transfer the read data by the main processing until it is posted on the completion of seek, so that for that duration the MPU is placed in the wait state for idle processing. Therefore, even though the settling wait processing is performed at step S105 attendant on the parameter setting instruction execution at step S104, the read data transfer speed is not particularly increased in this case.

Figure 14B:
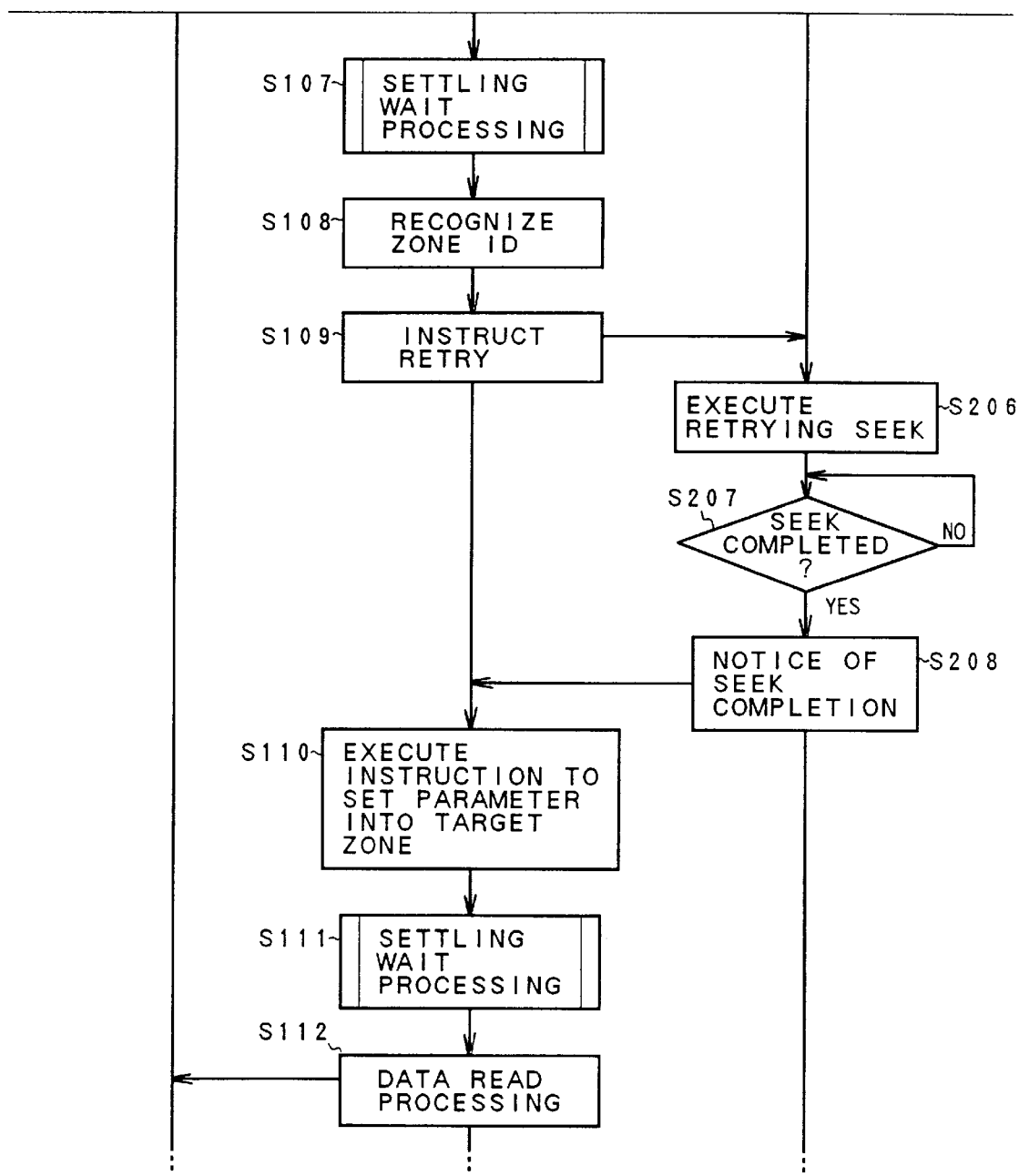

FIGS. 14A and 14B are time charts obtained when a seek error has taken place upon the execution of a seek instruction by the DSP 16 side in response to a read instruction from the host apparatus. The same as the time chart of FIG. 13 is the processing of steps S101 to S105 by the MPU 12 in response to an issue of a read instruction at step S1 by the host apparatus, as well as the processing of steps S201 to S203 by the DSP 16. In FIGS. 14A and 14B, however, the DSP 16 judges a seek error at step S204 as a result of fact that a track onto which a beam spot has been drawn by the execution of a seek instruction is not a target track but is a track belonging to a far adjacent zone, and posts the MPU 12 on a seek error at step S205. Upon a reception of the post on a seek error from the DSP 16, the MPU 12 is not capable of reading the data at a clock frequency of the frequency synthesizer 26 which corresponds to the zone number of a target track being currently set. Thus, the MPU 12 assumes an error zone and executes a parameter setting instruction corresponding to the zone number at step S106, performs a settling wait processing at step S107, and thereafter reads a track ID section for recognition at step S108 and instructs the DSP 16 on a retry of the seek instruction at step S109. In response to the retry instruction from the MPU, the DSP 16 executes a retry seek at step S206, draws a beam spot onto a correct target track at step S207 and when the seeking operation is complete, posts the MPU 12 on the seek completion at step S208. As a result of this, the MPU 12 executes a target zone parameter setting instruction at step S110, performs settling wait processing at step S111, and reads the data for the transfer to the host apparatus at step S112. In the case where in such processing of the MPU 12 executed when a seek error has occurred on the DSP 16 side, the MPU 12 again executes the error zone parameter setting instruction at step S106, performs the settling wait processing at step S107 and thereafter instructs the DSP 16 on a retry at step S109, the settling wait processing at step S107 is executed by calculating a wait time based on a settling time in response to a variation in the frequency dividing value of the frequency synthesizer 26 at step S106. This settling wait time involves no vain time so that the DSP 16 can be promptly instructed on the retry at step S108 without needing any additional settling wait time, which will apparently accelerate the read data transfer to the host apparatus.

Figure 15:
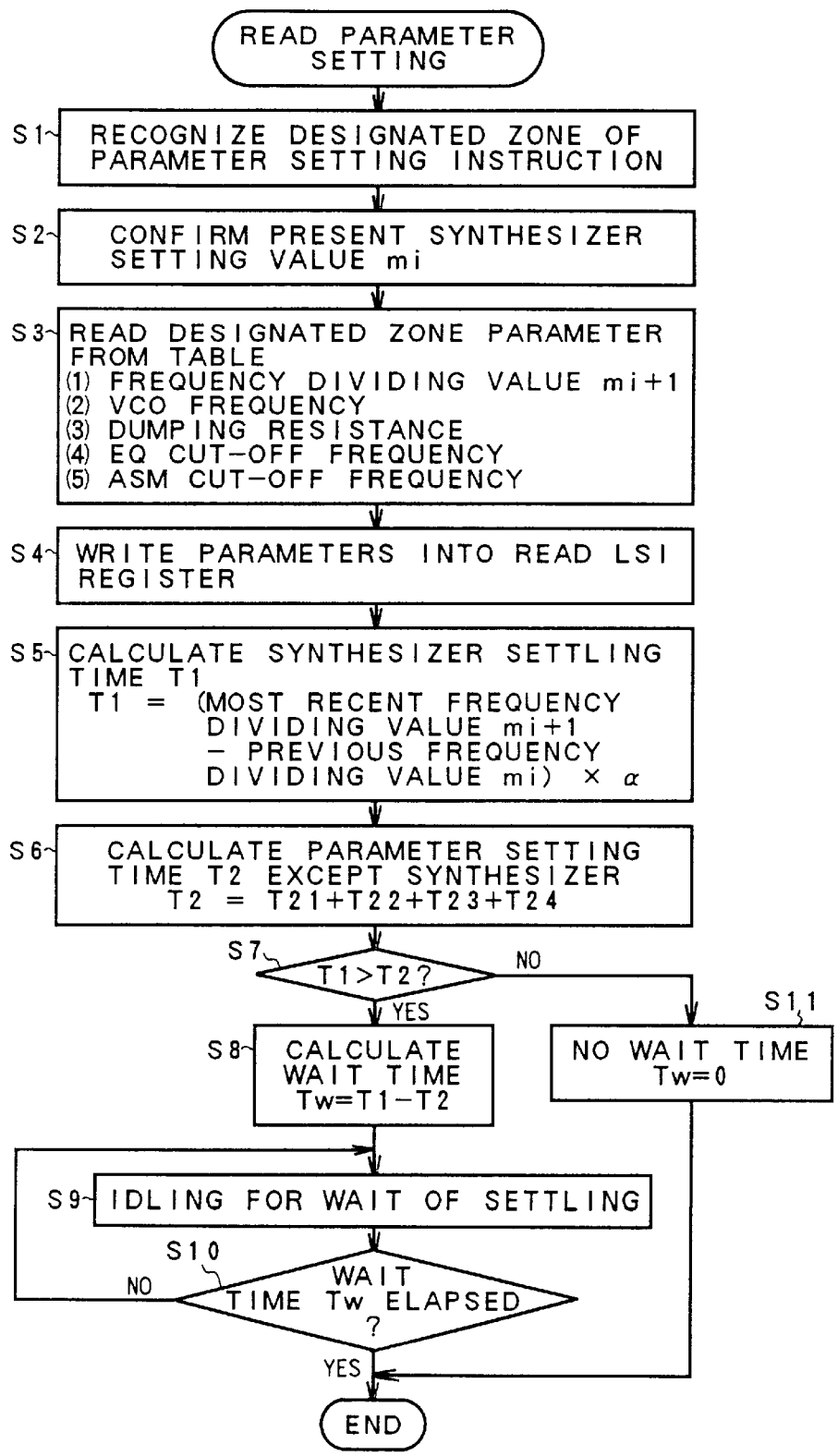
FIG. 15 is a flow chart of read parameter setting processing in accordance with the present invention, for calculating a settling time from a variance in frequency dividing values.

FIG. 15 is a flow chart of the execution of parameter setting instruction and the settling wait processing in the MPU 12 of FIG. 13 and FIGS. 14A and 14B, which are carried out by the setting control unit 90 and the settling wait processing unit 92 provided in the MPU 12 of FIG. 3. First, a designated zone of a parameter setting instruction is recognized from a target track number at step S1 and a current setting value mi of the frequency dividing value of the frequency synthesizer 26 is confirmed at step S2. To this end, the control register 96 of FIG. 3 is read and the results are stored in a RAM on the MPU 12 side. Then, at step S3, in the case of e.g. 540 MB medium, the 540 MB parameter table 94-1 as in FIG. 6 is referred to to read parameters corresponding to the zone numbers, of the frequency dividing values mi+1, VCO frequency, dumping resistor, EQ cut-off frequency and SM cut-off frequency, and at step S4, the parameters are written in the control registers 96, 98, 100, 102 provided in the read LSI circuit 24 of FIG. 3 and in the control register 106 of the optical disk controller 14. Then, at step S5, the settling time T1 of the frequency synthesizer 26 is calculated from $$T1=(\text{new frequency dividing value } mi+1 - \text{former frequency dividing value } mi) \times \alpha$$

Afterwards, at step S6, the parameter setting time T2 other than the frequency synthesizer 26 is calculated. Then, at step S7, the settling time T1 is compared in duration with the setting processing time T2, and if the settling time T1 is greater than the setting processing time T2, the wait time Tw is calculated from Tw=T1−T2 at step S8. At step S9, the MPU is placed in the wait state in which idling processing is performed for the settling wait over the wait time T2, and if the elapse of the wait time Tw is recognized at step S10, the MPU returns to the main routine. On the contrary, if the settling time T1 is less than the setting processing time T2 at step S7, then the wait time Tw is set to 0 at step S11, allowing the MPU 12 to continue the main processing without any idling processing.

Figure 16:
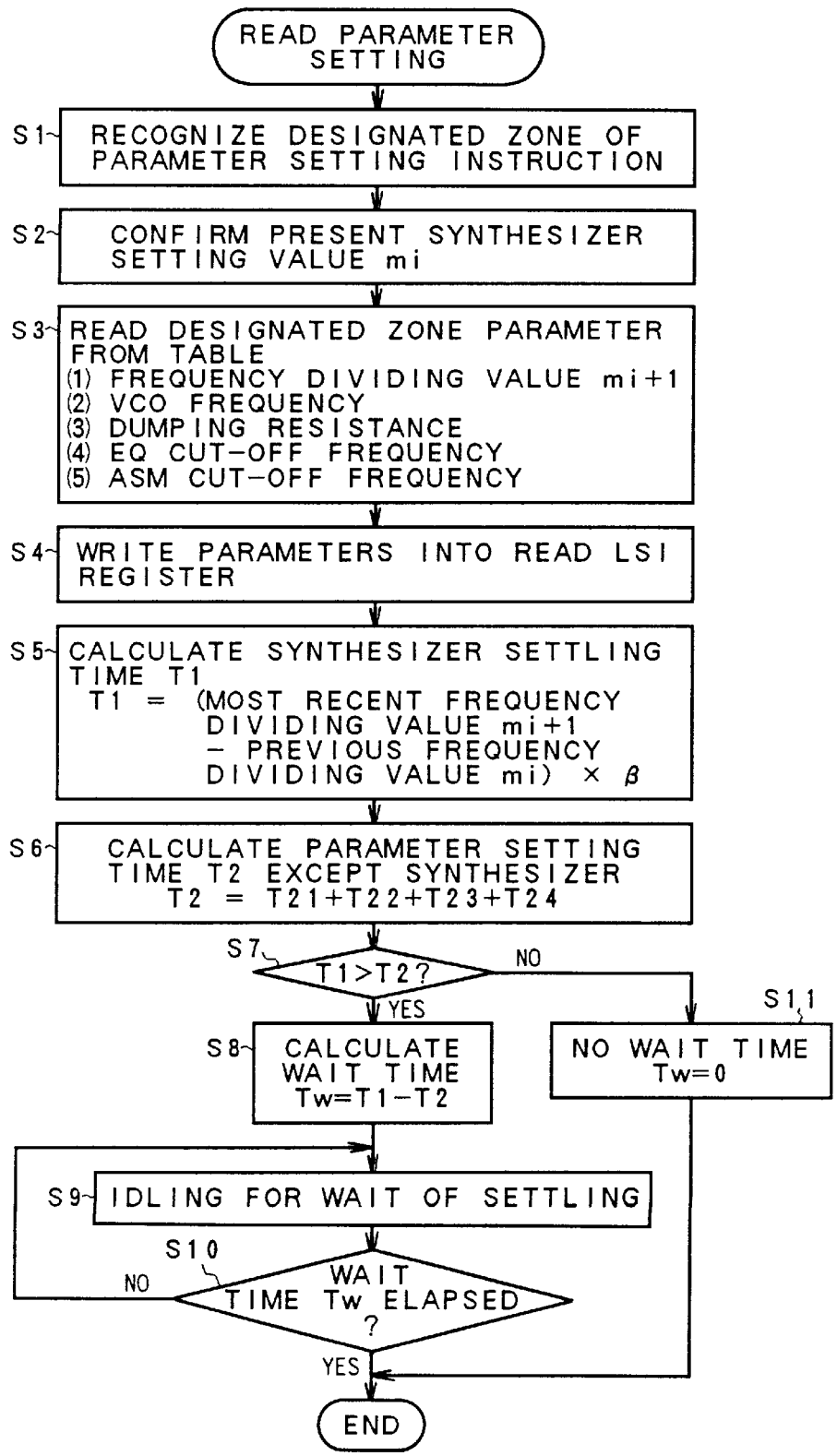
FIG. 16 is a flow chart of read parameter setting processing in accordance with the present invention, for calculating a settling time from a variance in zones.

FIG. 16 is a flow chart of another embodiment of the parameter setting control and settling wait processing in accordance with the present invention. Although in FIG. 15 the settling time T1 of the frequency synthesizer is calculated from a variation Δm in the frequency dividing value as in FIG. 10, the embodiment of FIG. 16 is characterized in that the synthesizer settling time T1 is calculated from a variation in the zone number. That is, in step S5 of FIG. 16, the synthesizer settling time T1 is given as $$T1=(\text{new zone } Zi+1 - \text{former zone } Zi) \times \beta$$

where the former zone Zi represents a current zone, the new zone represents a zone to which a target track belongs, and β represents a proportional coefficient corresponding to the variation in zone number. The processing of the other steps S1 to S4 and steps S6 to S11 is the same as that of the flow chart of FIG. 15.

Read LSI Single Parameter Setting Control and Settling Wait

Figures 17, 18:
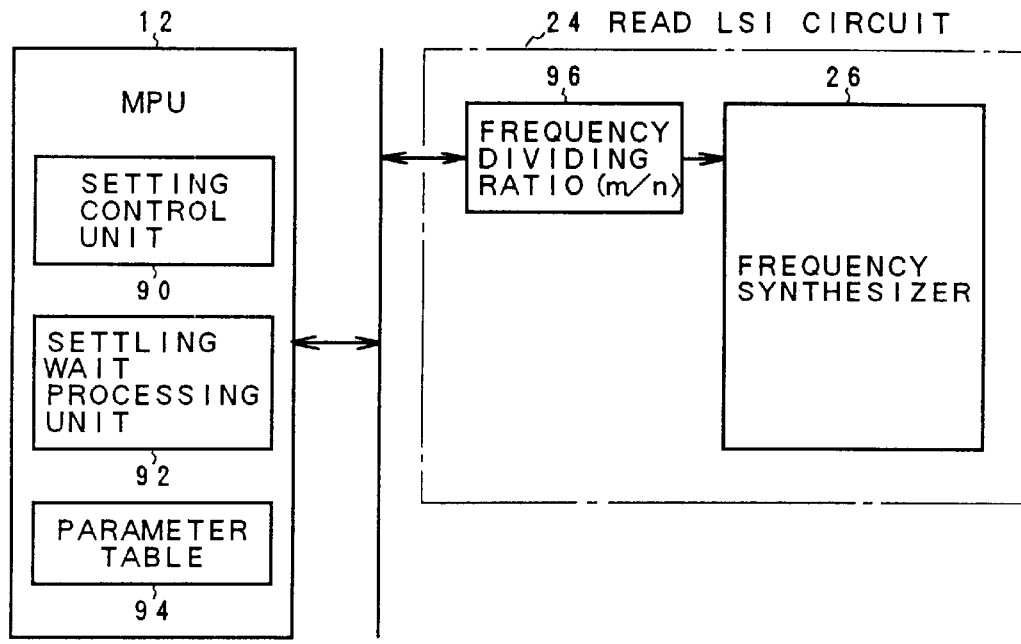
FIG. 17 is a functional block diagram of another embodiment of the present invention, performing only the setting control of the frequency synthesizer.
FIG. 18 is an explanatory diagram of a 540 MB parameter table for use in the embodiment of FIG. 17.

FIG. 17 illustrates a further embodiment of the present invention, which is characterized in that the setting control unit 90 of the MPU 12 controls the setting of only the frequency dividing ratio of the frequency synthesizer 26 provided in the read LSI circuit 24, and that the settling wait is performed by the wait time processing unit 92. In FIG. 17, therefore, the frequency synthesizer 26 in the read LSI circuit 24 of FIG. 3 and the associated control register 96 for setting the frequency dividing ration (m/n) are only visible.

FIG. 18 is a 540 MB parameter table 94-1 within the parameter table 94 provided in the MPU 12 for use in the embodiment of FIG. 17, in which are only stored a fixed frequency dividing value n and frequency dividing values m00 to m17 correlated with the clock frequencies f00 to f17 corresponding to the zone Nos. 0 to 17. FIG. 19 is a 640 MB parameter table 94-2, in which similarly are only stored a fixed frequency dividing value n and frequency dividing values m00 to m07 corresponding to the zone Nos. 0 to 7.

FIGS. 20A to 20C are timing charts of the embodiment of FIG. 17, which indicate a case where the variation in the frequency dividing value is large in the synthesizer frequency dividing ratio setting of FIG. 20A. In this case also, the settling time T1 by the settling time timer of FIG. 20B corresponds intactly to the wait time Tw, during which the MPU processing mode results in a wait mode for idling processing as in FIG. 20C.

FIGS. 21A to 21C indicate a case where the variation in the synthesizer frequency dividing value is small with the settling time T1 shorter than FIGS. 20A to 20C. In this case also, the short settling time T1 corresponds intactly to the wait time Tw, during which the MPU is placed in a wait processing for idling processing.

FIG. 22 is a flow chart of the parameter setting control and settling wait in accordance with the embodiment of FIG. 17. In order to recognize a designated zone of a parameter setting instruction at step S1 and to confirm a current setting frequency dividing ratio mi of the frequency synthesizer at step S2, the control register 96 is read and the results are stored in the RAM. Then, read from the parameter table 24 at step S3 is a frequency dividing value mi+1 of the frequency synthesizer 26 at a designated zone in which a target track is located, and at step S4 a frequency dividing value mi+1 is written in the control register 96 of the read LSI circuit 24, to initiate a change in setting to a clock frequency at the designated zone of the frequency synthesizer 26. Subsequently, at step S5 a difference between a new frequency dividing value mi+1 and a former frequency dividing value mi is multiplied by a predetermined coefficient a to obtain a settling time T1, and at step S6 the MPU performs idling processing for settling wait. At step S7 the settling time T1 is used intactly as a wait time Tw to check the elapse of the wait time Tw, and when the wait time tw has elapsed, the MPU is cleared of the idling processing to return to the main processing.

Figure 23:
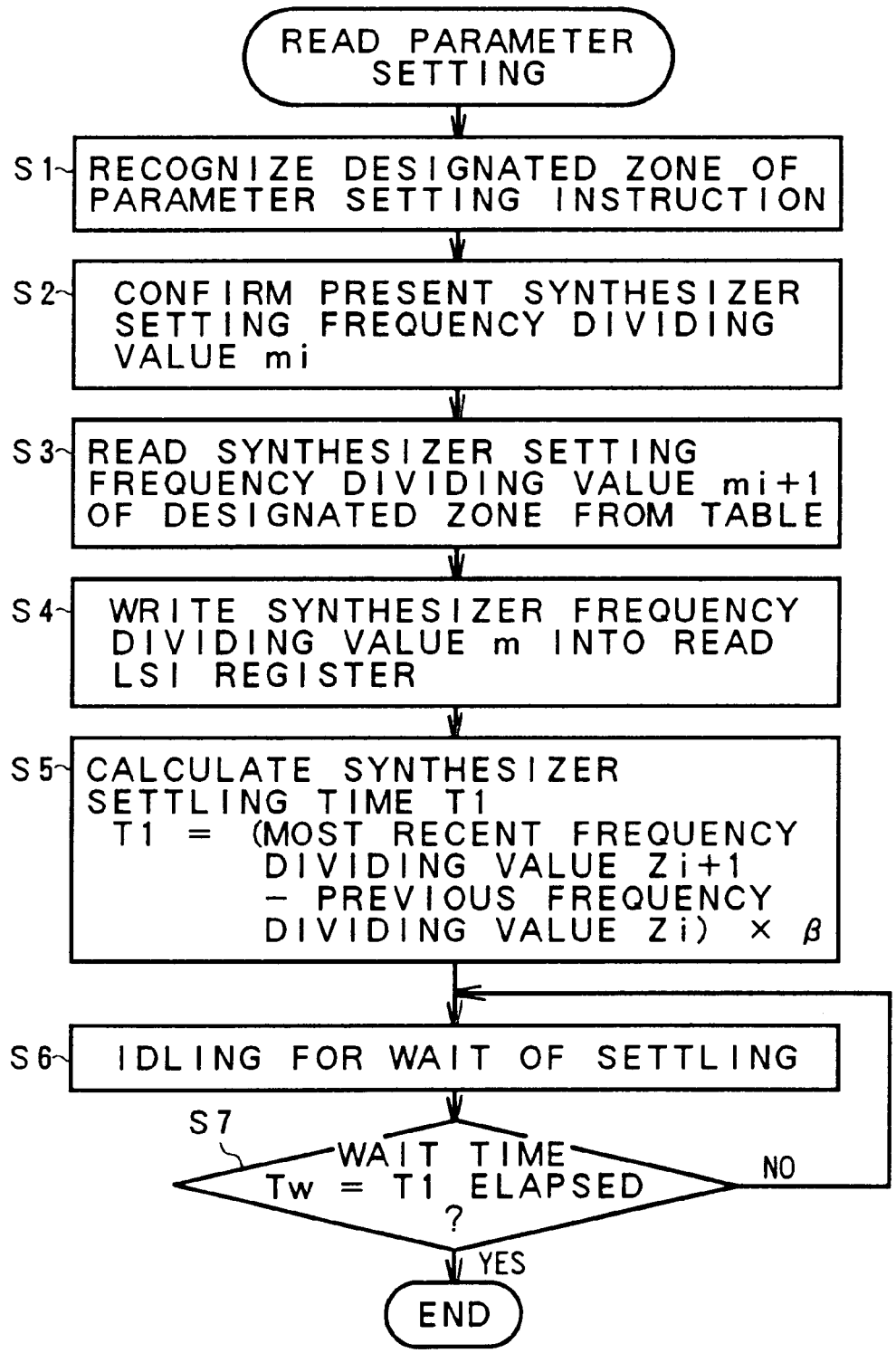
FIG. 23 is a flow chart of read parameter setting processing by FIG. 17 embodiment, for calculating a settling time from a variance in zones.

FIG. 23 is a flow chart of a further embodiment of the parameter setting control and settling wait of FIG. 17. This embodiment is characterized in that at step S5 a difference between a new zone, namely, a designated zone in which a target track is located and a former zone Zi being currently located is multiplied by a predetermined coefficient β to obtain the synthesizer settling time T1, with the other processing being the same as the flow chart of FIG. 22.

Parameter Setting Control and Settling Wait by Single Processor

Figure 24:
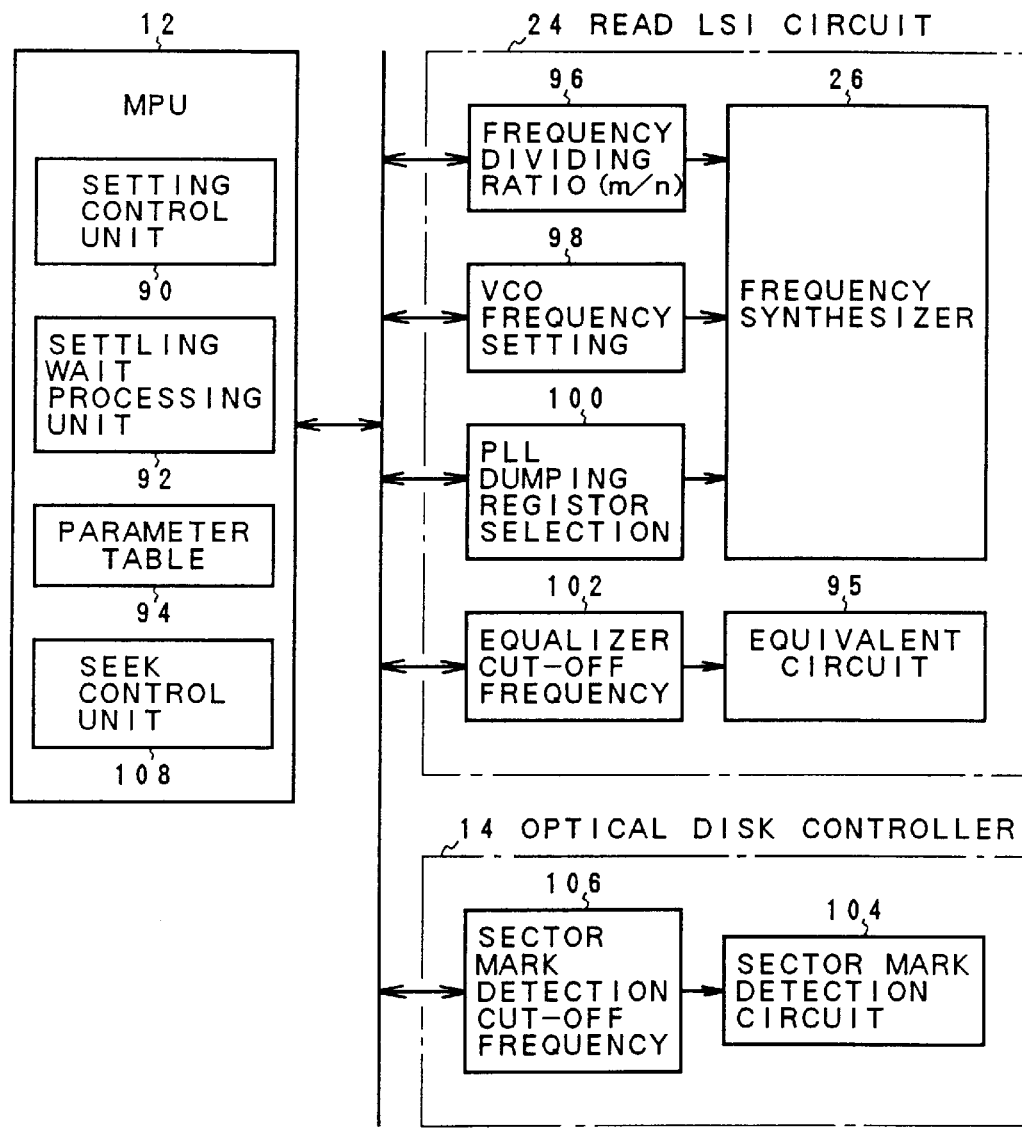
FIG. 24 is a functional block diagram of a further embodiment of the present invention, performing read LSI parameter setting control, settling wait processing and seek processing by means of only the MPU.

FIG. 24 is a functional block diagram showing a case in which the MPU 12 is intended to exclusively perform a series of read access processing in response to a read instruction from the host apparatus. In this embodiment, the MPU 12 includes as its function the seek processing unit 108 which has been executed by the DSP 16 in FIG. 3. For this reason, the MPU 12 executes a parameter setting instruction and a seek instruction in order, in response to a read instruction from the host apparatus. The configurations of the LSI circuit 24 side and the optical disk controller 14 is the same as those of FIG. 3.

Figure 25:
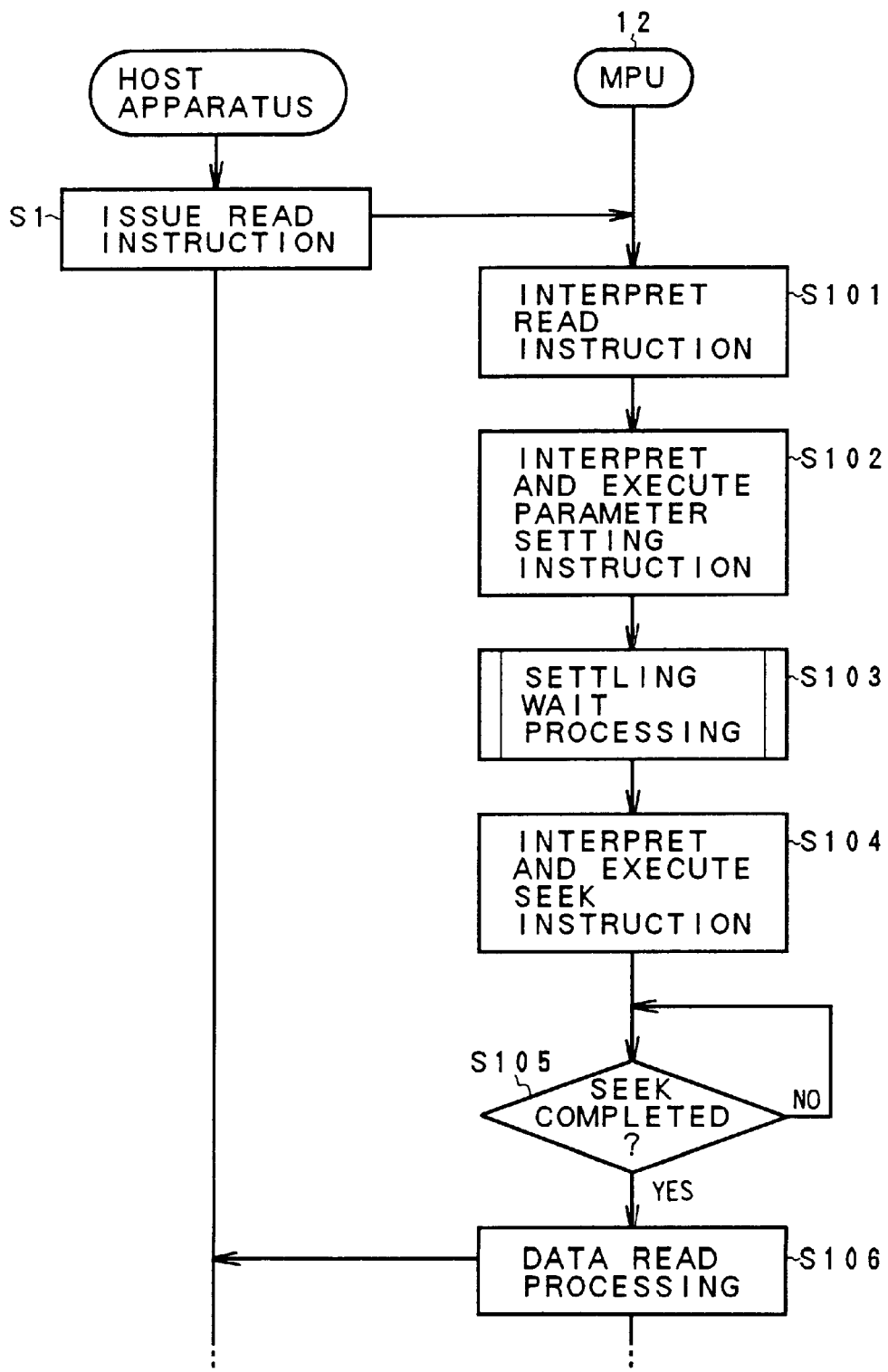
FIG. 25 is a flow chart of processing in response to a read instruction of FIG. 23.

FIG. 25 is a time chart showing a case in which a read instruction has been received from the host apparatus in accordance with the embodiment of FIG. 24. When the host apparatus issues a read instruction to the MPU 12 at step S1, the MPU 12 interprets the read instruction at step S101, first interprets and executes a parameter setting instruction at step S102 and then performs settling wait processing at step S103. After the completion of this settling wait processing, the MPU 12 interprets and executes a seek instruction at step S104 and, if it is judged that the seeking operation is complete at step S105, performs data read processing at step S106 to transfer the read data to the host apparatus. In the settling wait processing attendant on the parameter setting control of the present invention, in the case where the MPU 12 on the optical disk drive side executes solely the parameter setting instruction and the seek instruction in order as described above, it is possible to apparently accelerate the read data transfer to the host apparatus, without involving any vain time in the settling wait, by calculating the settling time T1 which is proportional to e.g., variation Δm in the frequency dividing ratio of the frequency synthesizer 26, placing the MPU, during that settling time, in a wait state for idling state and thereafter allowing the MPU to interpret and execute the seek instruction at step S104.

According to the present invention, as described hereinabove, it is possible to approximate a wait time required to be settled at a target frequency upon a change in setting of a frequency of the frequency synthesizer provided in the read LSI circuit, to a settling time required for the frequency synthesizer to actually become stabilized, by employing as the wait time a time which is proportional to a variation in the setting value for the frequency synthesizer. It is thus possible to minimize the wait time loss for waiting the settling, thereby accelerating the speed of data transfer to the host apparatus without any vain wait time.

In the case where, in connection with the settling wait time of the frequency synthesizer, changes in setting of the other processing units are performed simultaneously with a change in setting of the frequency synthesizer, employed as the wait time is a time obtained by subtracting the set processing times for the other processing unit from the set time, thereby eliminating vain wait time which may otherwise be required for the frequency synthesizer to become stable, to consequently accelerate the data transfer to the host apparatus.

Although the above embodiments are directed to the optical storage apparatus by way of example, it may be applied to a magnetic disk apparatus having a frequency synthesizer based on the zone CAV. It is to be appreciated that the present invention is not limited by the numerical values shown in the above embodiments. The clock frequency determined for each phase of a medium in particular is a parameter varying appropriately depending on the number of revolutions of the medium, the number of zones, byte count per sector, channel bit count per byte, etc.

Although the above embodiments are directed to 128 MB medium, 230 MB medium, 540 MB medium and 640 MB medium by way of example, it is natural that they are not limited by such medium capacities.

Furthermore, the above embodiments exemplify the setting processing for five processing units other than the frequency dividing ratio setting control of the frequency synthesizer. The number of the other processing units may also be appropriately determined depending on the read LSI circuit or the optical disk controller.

What is claimed is:

1. A storage apparatus comprising:
   a frequency synthesizer for generating, through setting of a frequency control value, a reference clock having a frequency necessary to read data from a medium;
   a setting control unit for setting, when reading data from an arbitrary position on a disk medium which is radially divided into a plurality of zones and is rotated at a constant angular velocity, a predetermined frequency control value corresponding to a read position on said medium in said frequency synthesizer so as to allow control of said reference clock frequency, said setting control unit setting a predetermined control value corresponding to said read position on said medium in at least one processing unit except for said frequency synthesizer; and
   a settling wait processing unit for keeping migration to the subsequent processing waiting during a wait time obtained by subtracting a setting processing time necessary for the setting control of said processing units except for said frequency synthesizer from a setting time required, after setting said frequency control value in said frequency synthesizer, to become stabilized at a corresponding frequency.

2. A storage apparatus according to claim 1, wherein said settling wait processing unit, when said settling time is greater than said setting processing time, keeps migration to the subsequent processing waiting during a wait time obtained by subtracting said setting processing time from said settling time, and when said settling time is less than said setting processing time, sets said wait time to zero permitting migration to the subsequent processing at a time when said setting processing time has elapsed.

3. A storage apparatus according to claim 1, wherein said settling wait unit calculates said settling time from a difference between the last frequency control value and the current frequency control value set in said frequency synthesizer by said setting control unit.

4. A storage apparatus according to claim 3, wherein said frequency synthesizer, in response to setting of a frequency dividing ratio (m/n) by said setting control unit, generates a reference clock having an output frequency fo obtained by multiplying an input clock frequency fi by said frequency dividing ratio (m/n); and wherein
said setting control unit sets in said frequency synthesizer a frequency dividing ratio (m/n) obtained by dividing a first frequency dividing value m corresponding to the zone position on a medium by a second frequency dividing value n corresponding to the type of said medium; and further wherein
said settling wait processing unit calculates said settling time from a difference between the last and current first frequency dividing values m.

5. A storage apparatus according to claim 1, wherein said settling wait processing unit calculates said settling time from a difference between the last read position on said medium and the current read position on said medium.

6. A storage apparatus according to claim 5, wherein said settling wait processing unit calculates said settling time from a difference between the last read zone position on said medium and the current read zone position on said medium.

7. A storage apparatus according to claim 1, wherein said storage apparatus is an optical storage apparatus in which information is optically written into and read from a medium.

8. A storage apparatus according to claim 1, wherein in addition to the setting of a frequency control value in said frequency synthesizer, said setting control unit executes:

setting of a resistance value for selecting a dumping factor of a PLL provided in said frequency synthesizer;

setting of a control voltage for controlling an oscillation frequency of a voltage-controlled oscillator provided in said frequency synthesizer, said control voltage being set to a predetermined frequency within a frequency range of said medium;

setting of a cut-off frequency of an equalizer for equalizing a data signal issued from a detector which has received a return light from a data region in a medium track sector; and setting of a cut-off frequency of a sector mark detection circuit for detecting a sector mark from an ID signal issued from said detector which has received a return light from a medium ID region.

9. A storage apparatus according to claim 7, wherein in parallel with execution of a seek instruction based on a read command from a host apparatus, said setting control unit and said settling wait processing unit execute setting control and settling wait, respectively, for said frequency synthesizer and said at least one processing unit.

10. A storage apparatus according to claim 9, wherein when execution of a seek instruction based on a read command from said host apparatus has resulted in a seek error, said setting control unit performs a control of setting corresponding to the error zone for said frequency synthesizer and said at least one processing unit, and allows execution of a retry seek operation at a time when a wait time by said settling wait processing unit has elapsed.

11. A storage apparatus according to claim 9 or 10, wherein an MPU executes processing of said setting control unit and of said settling wait processing unit, and a DSP executes said seek instruction.

12. A storage apparatus according to claim 7, wherein previous to execution of a seek instruction based on a read command from said host apparatus, said setting control unit and said settling wait processing unit execute setting control and settling wait processing, respectively, for said frequency synthesizer and said at least one processing unit.

13. A storage apparatus comprising:

a frequency synthesizer for generating, through setting of a frequency control value, a reference having a frequency necessary to read data from a medium;

a setting control unit for setting, when reading data from an arbitrary position on a disk medium which is radially divided into a plurality of zones and is rotated at a constant angular velocity, a predetermined frequency control value corresponding to said read position in said frequency synthesizer so as to allow control of said reference clock frequency; and a settling wait processing unit of calculating a settling time required, after the setting of said frequency control value in said frequency synthesizer, to become stabilized at a corresponding frequency, and for keeping migration to the subsequent processing waiting until said settling time elapses.

14. A storage apparatus according to claim 13, wherein said settling wait processing unit calculates said settling time from a difference between the last frequency control value and the current frequency control value set in said frequency synthesizer by said setting control unit.

15. A storage apparatus according to claim 14, wherein said frequency synthesizer, in response to setting of a frequency dividing ratio (m/n) by said setting control unit, generates a reference clock having an output frequency fo obtained by multiplying an input clock frequency fi by said frequency dividing ratio (m/n); and wherein said setting control unit sets in said frequency synthesizer a frequency dividing ratio (m/n) obtained by dividing a first frequency dividing value m corresponding to the zone position on a medium by a second frequency dividing value n corresponding to the type of said medium; and further wherein said settling wait processing unit calculates said settling time from a difference between the last and current first frequency dividing values m.

16. A storage apparatus according to claim 13, wherein said settling wait processing unit calculates said settling time from a difference between the last read position on said medium and the current read position on said medium.

17. A storage apparatus according to claim 16, wherein said settling wait processing unit calculates said settling time from a difference between the last read zone position on said medium and the current read zone position on said medium.

* * * * *

UNITED STATES PATENT AND TRADEMARK OFFICE
CERTIFICATE OF CORRECTION

PATENT NO. : 6,014,349  
DATED : January 01, 2000  
INVENTOR(S) : Iwasaki et al.

Page 1 of 1

It is certified that error appears in the above-identified patent and that said Letters Patent is hereby corrected as shown below:

<u>Column 20,</u>
Line 5, after "reference" insert -- clock --

Signed and Sealed this

Seventh Day of August, 2001

*Attest:*

NICHOLAS P. GODICI
*Attesting Officer*    *Acting Director of the United States Patent and Trademark Office*